(12) United States Patent
Kim et al.

(10) Patent No.: US 9,743,537 B2
(45) Date of Patent: Aug. 22, 2017

(54) ROLLABLE DISPLAY DEVICE AND METHOD OF MANUFACTURING THE SAME

(71) Applicant: SAMSUNG DISPLAY CO., LTD., Yongin, Gyeonggi-Do (KR)

(72) Inventors: Younjoon Kim, Seoul (KR); Sangjo Lee, Hwaseong-si (KR); Junghun Lee, Hwaseong-si (KR); Jusuck Lee, Seoul (KR); Mi Jang, Suwon-si (KR); Kyungmin Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 102 days.

(21) Appl. No.: 14/746,719

(22) Filed: Jun. 22, 2015

(65) Prior Publication Data
US 2016/0205791 A1 Jul. 14, 2016

(30) Foreign Application Priority Data

Jan. 13, 2015 (KR) .................. 10-2015-0006141

(51) Int. Cl.
*H05K 5/00* (2006.01)
*H05K 5/02* (2006.01)
(Continued)

(52) U.S. Cl.
CPC ......... *H05K 5/0017* (2013.01); *G06F 1/1652* (2013.01); *H05K 5/02* (2013.01); *H05K 13/00* (2013.01)

(58) Field of Classification Search
CPC ........ H05K 5/0017; H05K 13/00; H05K 5/02; G06F 1/1601; G06F 1/1652; G06F 1/1656
(Continued)

(56) References Cited

U.S. PATENT DOCUMENTS 8,493,714 B2 7/2013 Visser et al.
8,493,726 B2 7/2013 Visser et al.
(Continued)

FOREIGN PATENT DOCUMENTS

EP 1 912 416 A2 4/2008
KR 10-0818170 B1 4/2008
(Continued)

OTHER PUBLICATIONS

EPO Search Report dated May 24, 2016, for corresponding European Patent application 16150339.6, (10 pages).
(Continued)

*Primary Examiner* — Courtney Smith
*Assistant Examiner* — Sagar Shrestha
(74) *Attorney, Agent, or Firm* — Lewis Roca Rothgerber Christie LLP

(57) ABSTRACT

A rollable display device includes a flexible display panel, a housing, and a guide part. The flexible display panel is configured to display an image. The housing is configured to house the flexible display panel when the flexible display panel is rolled inside the housing. The guide part is provided at an edge portion of the flexible display panel. When the flexible display panel is rolled inside the housing, the flexible display panel includes a plurality of display panel layers, the display panel layers being spaced apart from each other.

16 Claims, 25 Drawing Sheets

(51) Int. Cl.
  *H05K 13/00* (2006.01)
  *G06F 1/16* (2006.01)

(58) Field of Classification Search
  USPC ............. 361/679.01–679.07, 679.21, 679.22
  See application file for complete search history.

(56) References Cited

U.S. PATENT DOCUMENTS

| | | | |
|---|---|---|---|
| 8,531,758 B2 | 9/2013 | van Lieshout et al. | |
| 8,773,411 B2 | 7/2014 | van Lieshout et al. | |
| 9,098,241 B1* | 8/2015 | Cho | H05K 1/028 |
| 2003/0160892 A1* | 8/2003 | Tamura | H04N 5/2251 |
| | | | 348/333.07 |
| 2004/0183958 A1 | 9/2004 | Akiyama et al. | |
| 2006/0038745 A1* | 2/2006 | Naksen | G06F 1/1624 |
| | | | 345/30 |
| 2007/0241002 A1 | 10/2007 | Wu et al. | |
| 2009/0141213 A1* | 6/2009 | Chiu | G02F 1/13336 |
| | | | 349/73 |
| 2010/0265426 A1 | 10/2010 | Jeon et al. | |
| 2011/0043976 A1 | 2/2011 | Visser et al. | |
| 2013/0222998 A1* | 8/2013 | Cho | G06F 1/1601 |
| | | | 361/679.27 |
| 2014/0055924 A1 | 2/2014 | Baek et al. | |
| 2014/0347806 A1* | 11/2014 | Totani | G06F 1/1647 |
| | | | 361/679.27 |
| 2015/0022436 A1* | 1/2015 | Cho | G06F 1/1652 |
| | | | 345/156 |
| 2015/0268914 A1* | 9/2015 | Kim | G06F 3/1423 |
| | | | 345/1.3 |
| 2015/0316962 A1* | 11/2015 | Howes | G03B 21/58 |
| | | | 16/87.2 |
| 2016/0132281 A1* | 5/2016 | Yamazaki | G06F 3/1446 |
| | | | 345/1.3 |
| 2016/0187929 A1* | 6/2016 | Kim | G06F 1/1652 |
| | | | 345/184 |
| 2016/0363959 A1* | 12/2016 | Rider | G06F 1/1652 |

FOREIGN PATENT DOCUMENTS

| | | |
|---|---|---|
| KR | 10-2010-0017284 A | 2/2010 |
| KR | 10-1417184 B1 | 7/2014 |
| WO | WO 92/12508 A1 | 7/1992 |
| WO | WO 2014/057171 A1 | 4/2014 |

OTHER PUBLICATIONS

Abstract for Korean Publication No. 20100016501 A, Corresponding to Korean Patent No. 10-1417184 B1, Jul. 8, 2014, 1 page.

* cited by examiner

ROLLABLE DISPLAY DEVICE AND METHOD OF MANUFACTURING THE SAME

CROSS-REFERENCE TO RELATED APPLICATION

This patent application claims priority to and the benefit of Korean Patent Application No. 10-2015-0006141, filed on Jan. 13, 2015, the contents of which are hereby incorporated by reference in their entirety.

BACKGROUND

1. Field

The present disclosure relates to a rollable display device and a method of manufacturing the same.

2. Description of the Related Art

As the market demand for flexible display devices continues to increase, various flexible display devices, such as a curved display device having a specific curvature, a foldable display device having a specific radius of curvature or bent with respect to a folding axis, and a rollable display device rolled to a specific radius of curvature have been developed.

The rollable display device typically has a wide display area, superior mobility, etc.

SUMMARY

The present disclosure provides a rollable display device having improved display quality.

The present disclosure provides a method of manufacturing the rollable display device.

One or more embodiments of the inventive concept provide a rollable display device including a flexible display panel, a housing, and a guide part. The flexible display panel is configured to display an image. The housing is configured to house the flexible display panel when the flexible display panel is rolled inside the housing. The guide part is at an edge portion of the flexible display panel. When the flexible display panel is rolled inside the housing, the flexible display panel includes a plurality of display panel layers that are spaced apart from each other.

When the flexible display and the guide part on the flexible display panel are rolled inside the housing, the guide part includes a plurality of guide part layers that contact each other.

The edge portion of the flexible display panel includes a lower surface edge portion at a lower surface of the flexible display panel and an upper surface edge portion at an upper surface of the flexible display panel, and the guide part includes a lower surface guide part overlapped with the lower surface edge portion and an upper surface guide part overlapped with the upper surface edge portion and the lower surface guide part.

The guide part further includes a side surface guide part connecting the lower surface guide part and the upper surface guide part and covering a side surface of the flexible display panel.

The side surface guide part includes a lower side surface guide part connected to the lower surface guide part and an upper side surface guide part connected to the upper surface guide part.

The lower surface edge portion includes a first lower surface edge portion, a second lower surface edge portion spaced apart from the first lower surface edge portion, a third lower surface edge portion connected to the first and second lower surface edge portions, and a fourth lower surface edge portion spaced apart from the third lower surface edge portion and connected to the first and second lower surface edge portions. The upper surface edge portion includes a first upper surface edge portion, a second upper surface edge portion spaced apart from the first upper surface edge portion, a third upper surface edge portion connected to the first and second upper surface edge portions, and a fourth upper surface edge portion spaced apart from the third upper surface edge portion and connected to the first and second upper surface edge portions. The lower surface guide part includes a first lower surface guide part overlapped with the first lower surface edge portion and a second lower surface guide part overlapped with the second lower surface edge portion. The upper surface guide part includes a first upper surface guide part overlapped with the first upper surface edge portion and the first lower surface guide part and a second upper surface guide part overlapped with the second upper surface edge portion and the second lower surface guide part.

The flexible display panel includes a first flexible display panel inside the housing and a second flexible display panel connected to the first flexible display panel and configured to be exposable to an outside of the housing. The guide part includes a first guide part inside the housing and at an edge portion of the first flexible display panel and a second guide part outside the housing and at an edge portion of the second flexible display panel.

The edge portion of the first flexible display panel includes a first lower surface edge portion of a lower surface of the first flexible display panel and a first upper surface edge portion of an upper surface of the first flexible display panel. The first guide part includes a first lower surface guide part overlapped with the first lower surface edge portion and a first upper surface overlapped with the first upper surface edge portion and the first lower surface guide part.

The first lower surface edge portion includes a first sub-lower surface edge portion, a second sub-lower surface edge portion spaced apart from the first sub-lower surface edge portion, a third sub-lower surface edge portion connected to the first sub-lower surface edge portion and the second sub-lower surface edge portion, and a fourth sub-lower surface edge portion spaced apart from the third sub-lower surface edge portion and connected to the first sub-lower surface edge portion and the second sub-lower surface edge portion. The first upper surface edge portion includes a first sub-upper surface edge portion, a second sub-upper surface edge portion spaced apart from the first sub-upper surface edge portion, a third sub-upper surface edge portion connected to the first sub-upper surface edge portion and the second sub-upper surface edge portion, and a fourth sub-upper surface edge portion spaced apart from the third sub-upper surface edge portion and connected to the first sub-upper surface edge portion and the second sub-upper surface edge portion. The first lower surface guide part includes a first sub-lower surface guide part overlapped with the first sub-lower surface edge portion and a second sub-lower surface guide part overlapped with the second sub-lower surface edge portion. The first upper surface guide part includes a first sub-upper surface guide part overlapped with the first sub-upper surface edge portion and the first sub-lower surface guide part and a second sub-upper surface guide part overlapped with the second sub-upper surface edge portion and the second sub-lower surface guide part.

The edge portion of the second flexible display panel includes a second lower surface edge portion of a lower surface of the second flexible display panel and a second upper surface edge portion of an upper surface of the second flexible display panel. The second guide part includes a second lower surface guide part overlapped with the second lower surface edge portion and a second upper surface guide part overlapped with the second upper surface edge portion and the second sub lower surface guide part.

The second lower surface edge portion includes a fifth sub-lower surface edge portion, a sixth sub-lower surface edge portion spaced apart from the fifth sub-lower surface edge portion, a seventh sub-lower surface edge portion connected to the fifth sub-lower surface edge portion and the sixth sub-lower surface edge portion, and an eighth sub-lower surface edge portion spaced apart from the seventh sub-lower surface edge portion and connected to the fifth sub-lower surface edge portion and the sixth sub-lower surface edge portion. The second upper surface edge portion includes a fifth sub-upper surface edge portion, a sixth sub-upper surface edge portion spaced apart from the fifth sub-upper surface edge portion, a seventh sub-upper surface edge portion connected to the fifth sub-upper surface edge portion and the sixth sub-upper surface edge portion, and an eighth sub-upper surface edge portion spaced apart from the seventh sub-upper surface edge portion and connected to the fifth sub-upper surface edge portion and the sixth sub-upper surface edge portion. The second lower surface guide part includes a third lower surface guide part overlapped with the fifth sub-lower surface edge portion and a fourth lower surface guide part overlapped with the sixth sub-lower surface edge portion. The second upper surface guide part includes a third upper surface guide part overlapped with the fifth sub-upper surface edge portion and the third lower surface guide part and a fourth upper surface guide part overlapped with the sixth sub-upper surface edge portion and the fourth lower surface guide part.

The rollable display device further includes a grip part connected to the flexible display panel.

The grip part includes an upper grip part on the flexible display panel and overlapped with at least a portion of the flexible display panel and a lower grip part under the flexible display panel and overlapped with at least a portion of the flexible display panel.

The grip part further includes a side grip part that covers a side surface of the flexible display panel and is connected to the upper and lower grip parts.

The rollable display device further includes a fixing screw that connects the upper grip part to the lower grip part and fixes the upper and lower grip parts to each other.

One or more embodiments of the inventive concept provide a method of manufacturing a rollable display device, including preparing a flexible display panel, providing a guide part at an edge portion of the flexible display panel, and connecting the flexible display panel to a housing. The flexible display panel is configured to be rolled inside the housing, and when the flexible display panel is rolled inside the housing, the flexible display panel includes a plurality of display panel layers. The plurality of display panel layers are spaced apart from each other by the guide part.

The providing of the guide part includes providing a lower surface guide part on a lower surface edge portion of a lower surface of the flexible display panel and providing an upper surface guide part on an upper surface edge portion of an upper surface of the flexible display panel.

The providing of the guide part further includes providing a side guide part that connects the lower surface guide part and the upper surface guide part.

The providing of the guide part includes providing a lower guide part on a lower surface edge portion of a lower surface of the flexible display panel and on a side surface of the flexible display panel and providing an upper guide part on an upper surface edge portion of an upper surface of the flexible display panel, on a side surface of the flexible display panel, and on the lower guide part.

According to the above, the display quality of the rollable display device is improved.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Figure 1A:
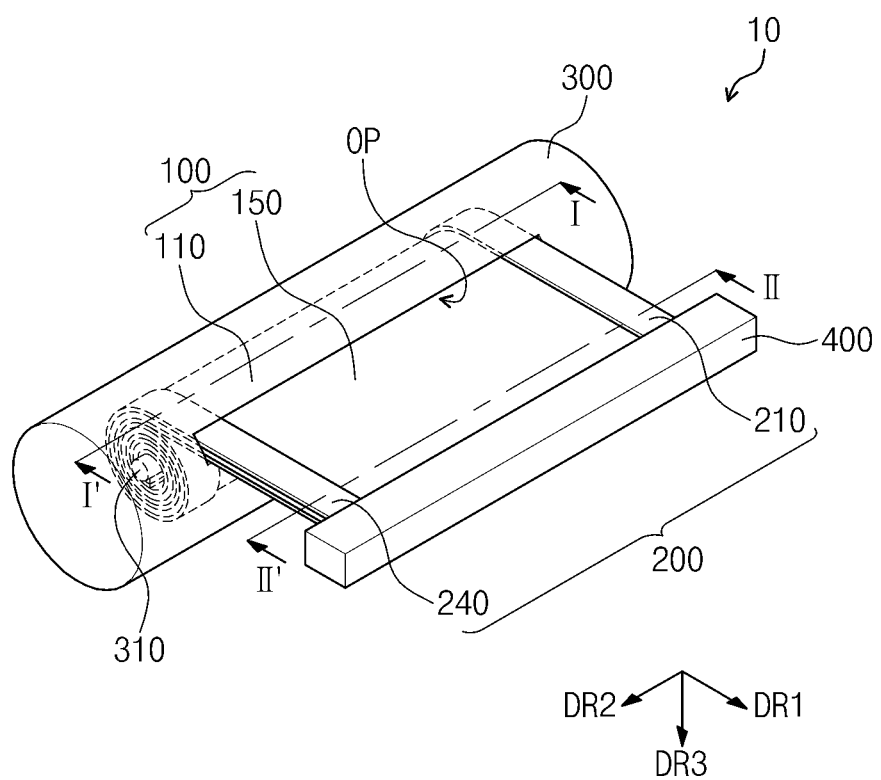
FIGS. 1A to 1D are perspective views of a rollable display device according to one or more embodiments of the present disclosure.

It will be understood that when an element or layer is referred to as being "on", "connected to" or "coupled to" another element or layer, it can be directly on, connected or coupled to the other element or layer or intervening elements or layers may be present. When an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As used herein, the term "substantially," "about," and similar terms are used as terms of approximation and not as terms of degree, and are intended to account for the inherent variations in measured or calculated values that would be recognized by those of ordinary skill in the art.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A to 1D are perspective views of a rollable display device 10 according to one or more embodiments of the present disclosure.

Figure 1B:
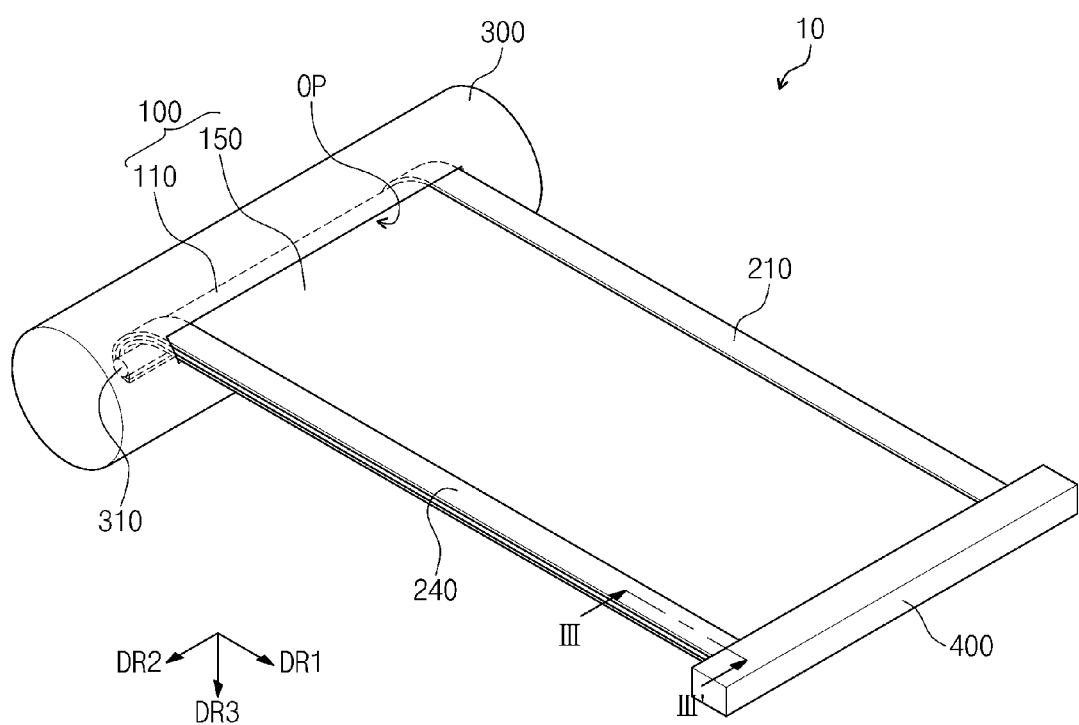
Figure 1C:
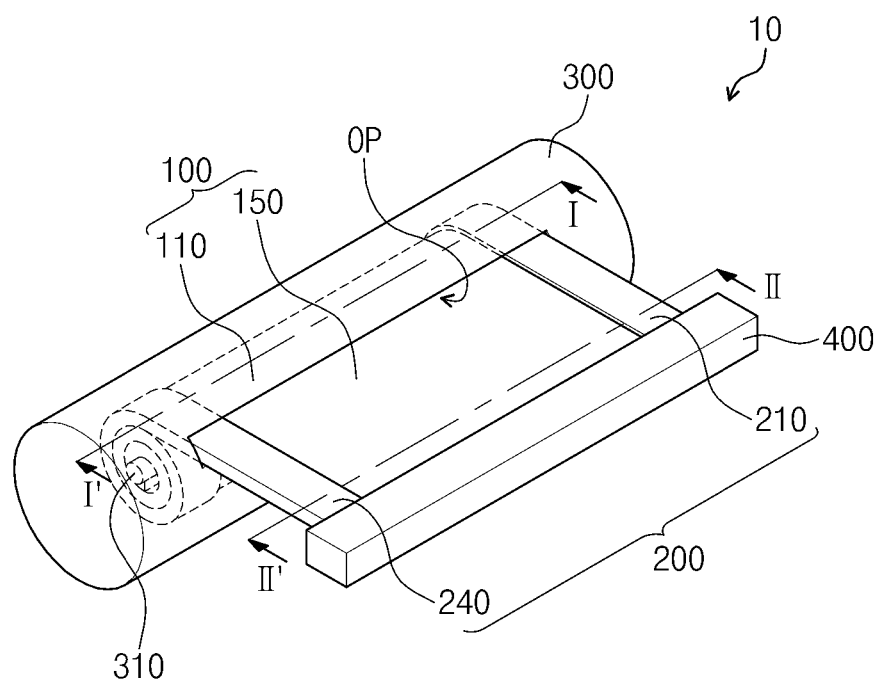
Figure 1D:
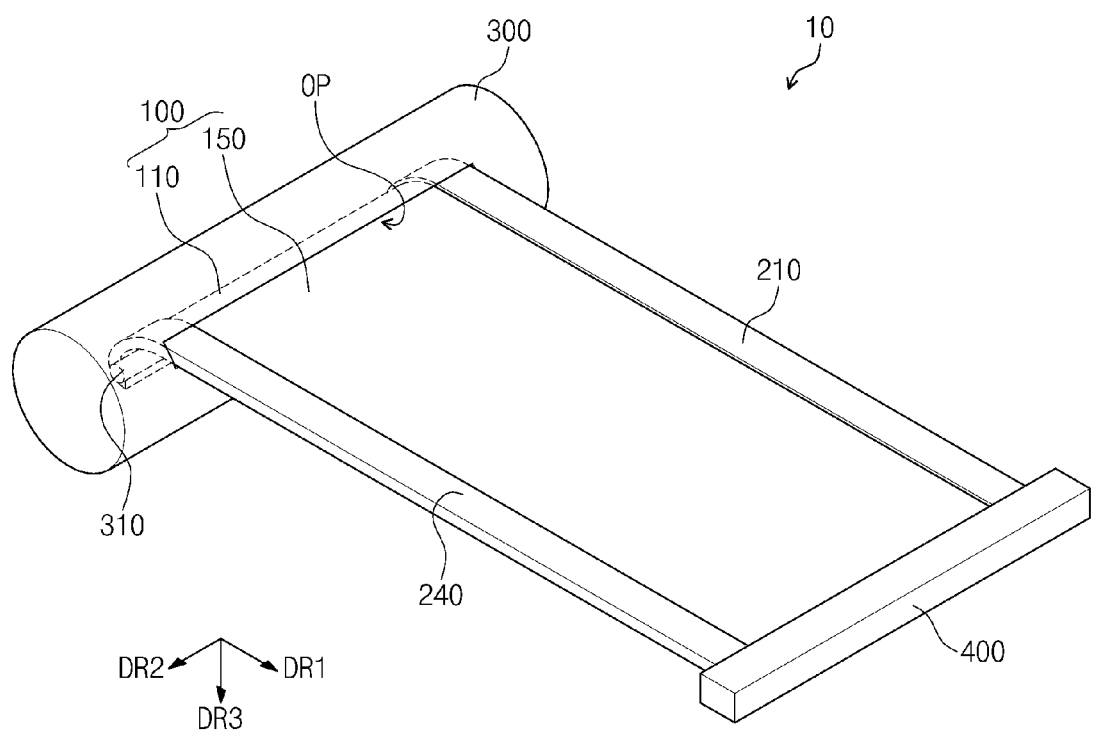
Figure 2A:
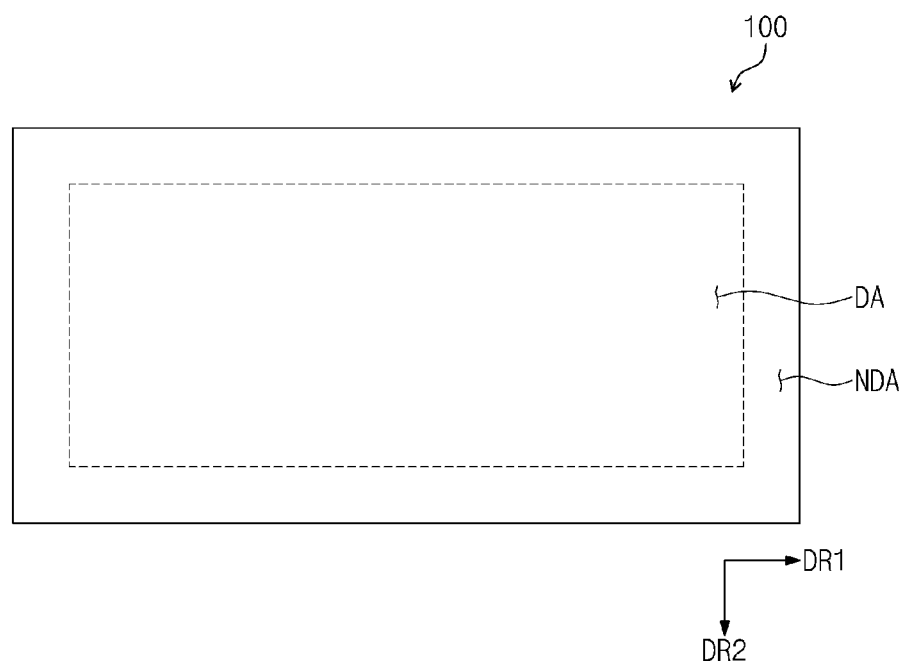
FIGS. 2A to 2E are plan views of a flexible display panel of a rollable display device according to one or more embodiments of the present disclosure.
Figure 2B:
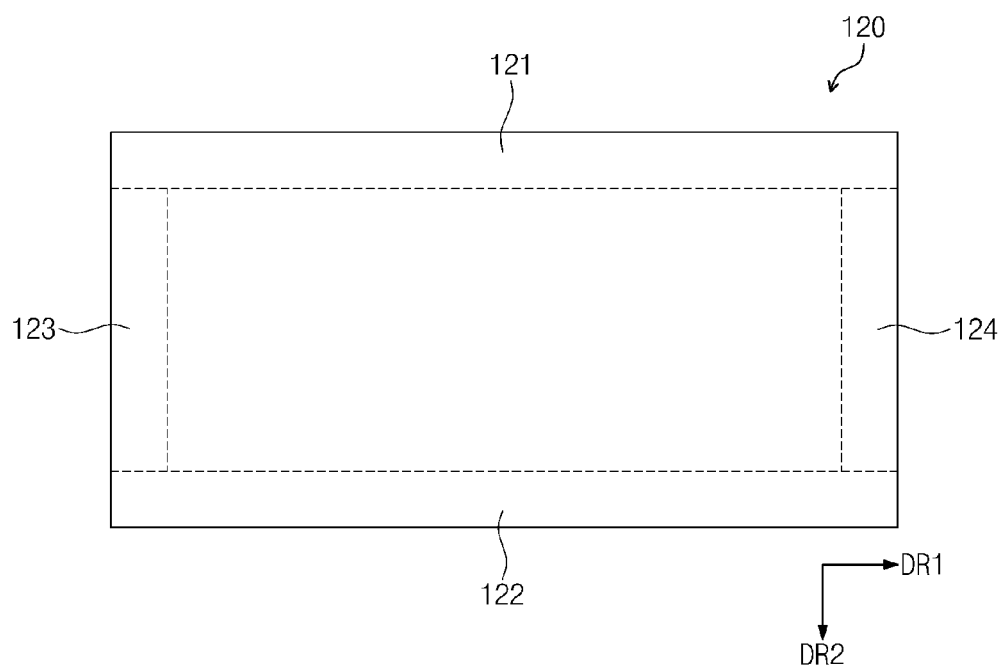
Figure 2C:
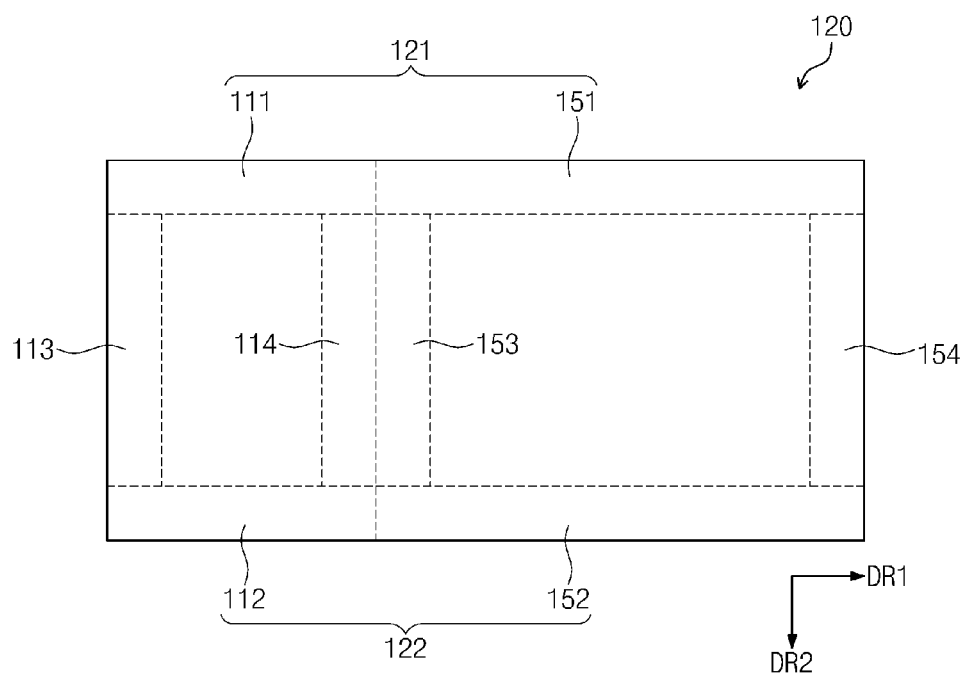
Figure 2D:
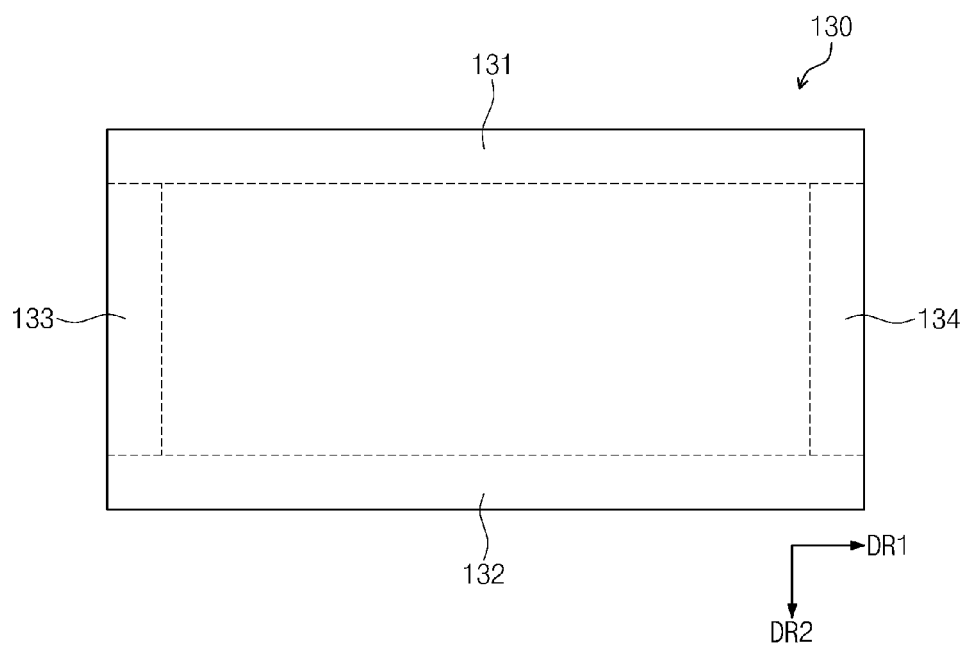
Figure 2E:
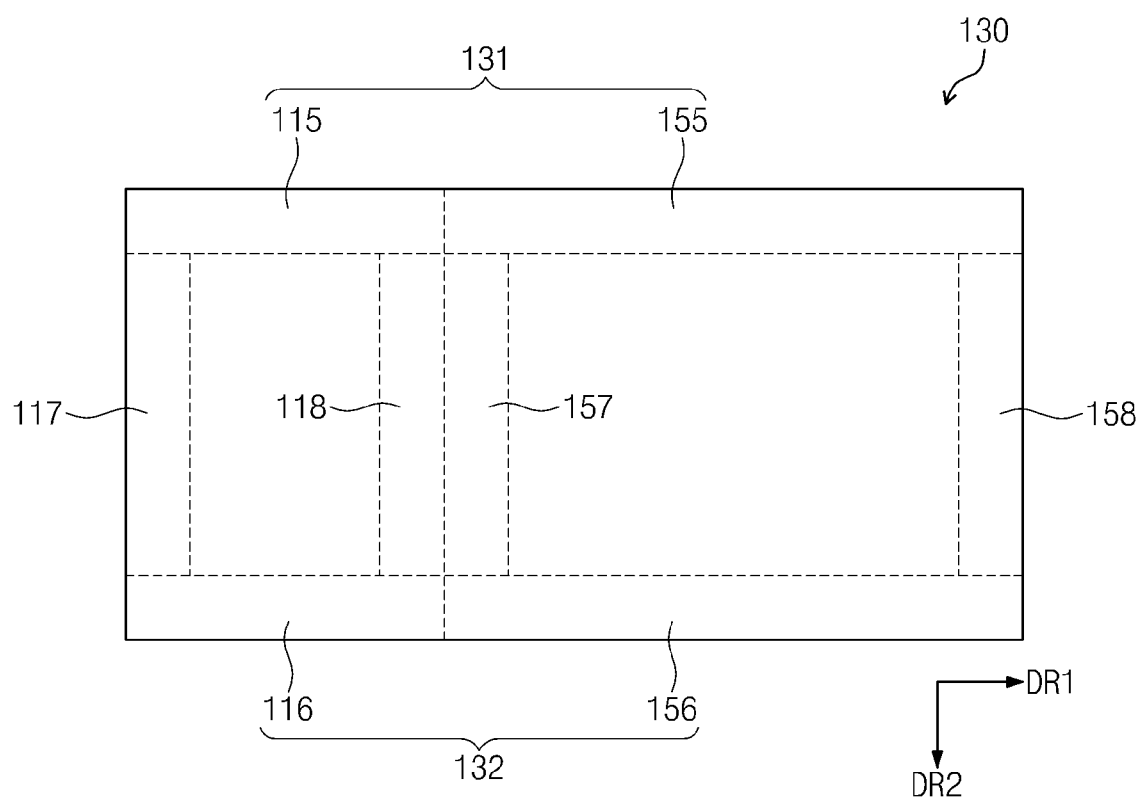

Referring to FIGS. 1A to 1D, the rollable display device 10 includes a flexible display panel 100, a guide part 200, and a housing 300. The flexible display panel 100 is configured to display an image. The housing 300 includes an opening OP formed therein. Referring to FIGS. 1A and 1C, the flexible display panel 100 may be rolled and kept (or housed or stored) inside the housing 300. Referring to FIGS. 1B and 1D, the flexible display panel 100 may be exposed to the outside of the housing 300 by an external force applied to the flexible display panel 100.

The rollable display device 10 may further include a grip part 400. In some embodiments, the grip part 400 may be omitted. The grip part 400 is connected to the flexible display panel 100. The grip part 400 is described further below.

Referring to FIGS. 1A to 1D, the flexible display panel 100 includes a flexible substrate, and thus the flexible display panel 100 has flexibility. The flexible display panel 100 may include at least one of polycarbonate (PC), polyethyleneterephthalate (PET), polyethylene (PE), polypropylene (PP), polysulfone (PSF), polymethylmethacrylate (PMMA), triacetylcellulose (TAO), cycloolefin polymer (COP), and cycloolefin copolymer (COC).

The flexible display panel 100 is rolled and/or stretched around a reel core 310 with respect to a rolling axis in the housing 300. The flexible display panel 100 may be exposed (i.e., the flexible display panel 100 is exposable) to the outside of the housing 300 by an external force applied to the flexible display panel 100. For example, upon application of an external force, the flexible display panel 100, which is rolled and kept inside the housing 300, may be exposed to the outside of the housing 300 after passing through the opening OP in the housing 300.

The housing 300 accommodates the flexible display panel 100. As shown in FIGS. 1A to 1D, the housing 300 may have a substantially cylindrical shape, but the shape of the housing 300 is not limited thereto. For example, the housing 300 may have any suitable shape as long as the flexible display panel 100 may be rolled and kept inside the housing 300. In one or more embodiments, as shown in FIGS. 1A to 1D, the housing 300 may be integrally formed as a singular (or individual) unit, but is not limited thereto. For example, the housing 300 may be formed by assembling two or more sub-housings with each other.

The housing 300 includes the reel core 310 on which the flexible display panel 100 is rolled with respect to the rolling axis. The rolling axis is substantially parallel to a second direction DR2 that is perpendicular (or substantially perpendicular) to first and third directions DR1 and DR3. The reel core 310 has a substantially cylindrical shape that is elongated along the rolling axis.

The flexible display panel 100 is rolled and kept (e.g., housed) inside the housing 300. For example, the flexible display panel 100 may be connected to the reel core 310 that is disposed in the housing 300, and then rolled or stretched around the reel core 310. As shown in FIGS. 1A to 1D, the flexible display panel 100 may be rolled around (or surround) the reel core 310, but it is not limited thereto. For example, the reel core 310 may include a coupling recess and the flexible display panel 100 may be coupled to the coupling recess.

In FIGS. 1A to 1D, the reel core 310 is integrally formed as a singular (or individual) unit, but it is not limited thereto. For example, the reel core 310 may be manufactured by assembling two or more sub-reel cores with each other.

FIGS. 2A to 2E are plan views of a flexible display panel of a rollable display device according to one or more embodiments of the present disclosure.

Referring to FIGS. 1A to 1D and 2A to 2E, the flexible display panel 100 may have a substantially rectangular shape when viewed from the third direction DR3 (also referred to herein as a thickness direction) of the flexible display panel 100, but the shape of the flexible display panel 100 is not limited thereto.

The flexible display panel 100 includes a display area DA and a non-display area NDA. The non-display area NDA surrounds the display area DA. The display area DA may have a substantially rectangular shape when viewed from the third direction DR3 of the flexible display panel 100, but the shape of the display area DA is not limited thereto.

An image may be displayed in the display area DA (i.e., the flexible display panel 100 may be configured to display an image in the display area DA). A plurality of pixels may be arranged in the display area DA to form the image. Each pixel may include at least one thin film transistor.

The image is not displayed in the non-display area NDA (i.e., the flexible display panel 100 is not configured to display an image in the non-display area NDA). A driving part is disposed in the non-display area NDA. The driving part is electrically connected to the pixels to apply signals to the pixels. The driving part includes a data driver that converts an image signal to a data signal and applies the data signal to the flexible display panel 100 and a gate driver that applies a gate signal to the flexible display panel 100. At least one of the data driver and the gate driver may be manufactured in the form of a chip and then mounted on a tape carrier package or a printed circuit board.

The flexible display panel 100 may include a base substrate and an image display part.

The base substrate may be a transparent insulating substrate, but it is not limited thereto. The base substrate may include at least one of polycarbonate (PC), polyethyleneterephthalate (PET), polyethylene (PE), polypropylene (PP), polysulfone (PSF), polymethylmethacrylate (PMMA), triacetylcellulose (TAO), cycloolefin polymer (COP), and/or cycloolefin copolymer (COC).

When viewed from the third direction DR3, the base substrate may have a substantially rectangular shape, but the shape of the base substrate is not limited thereto, and may be any suitable shape.

The image display part is disposed on the base substrate and displays the image (i.e., is configured to display the image). The image display part emits a light or controls a light incident thereto. The image display part may be one of an electrophoretic display device, an electrowetting display device, and an organic light emitting display device, any of which may be used in the rollable display device 10. Hereinafter, for ease of description the image display part is described with reference to the organic light emitting display device.

The image display part may include an anode electrode, an organic light emitting layer, and a cathode electrode. Holes and electrons injected into the organic light emitting layer from the anode and cathode electrodes, respectively, are recombined in the organic light emitting layer to generate excitons, and the image display part emits the light by the excitons that return to a ground state from an excited state.

The flexible display panel 100 may include a lower surface 120 and an upper surface 130. The lower surface 120 of the flexible display panel 100 includes a first lower surface edge portion 121, a second lower surface edge portion 122, a third lower surface edge portion 123, and a fourth lower surface edge portion 124. The upper surface 130 of the flexible display panel 100 includes a first upper surface edge portion 131, a second upper surface edge portion 132, a third upper surface edge portion 133, and a fourth upper surface edge portion 134. The guide part 200 is provided on the first and second lower surface edge portions 121 and 122 and the first and second upper surface edge portions 131 and 132.

The first, second, third, and fourth lower surface edge portions 121, 122, 123, and 124 are overlapped with (or correspond to) the non-display area NDA. Each of the first, second, third, and fourth lower surface edge portions 121, 122, 123, and 124 may have a substantially rectangular shape.

The first lower surface edge portion 121 includes a first sub-lower surface edge portion 111 and a fifth sub-lower surface edge portion 151. The second lower surface edge portion 122 is spaced apart from the first lower surface edge portion 121 in the second direction DR2. The second lower surface edge portion 122 includes a second sub-lower surface edge portion 112 and a sixth sub-lower surface edge portion 152.

The third lower surface edge portion 123 is connected to the first and second lower surface edge portions 121 and 122. The fourth lower surface edge portion 124 is spaced apart from the third lower surface edge portion 123 in the first direction DR1. The fourth lower surface edge portion 124 is connected to the first and second lower surface edge portions 121 and 122.

The first, second, third, and fourth upper surface edge portions 131, 132, 133, and 134 are overlapped with (or correspond to) the non-display area NDA. Each of the first, second, third, and fourth upper surface edge portions 131, 132, 133, and 134 has a substantially rectangular shape.

The first upper surface edge portion 131 includes a first sub-upper surface edge portion 115 and a fifth sub-upper surface edge portion 155. The second upper surface edge portion 132 is spaced apart from the first upper surface edge portion 131 in the second direction DR2. The second upper surface edge portion 132 includes a second sub-upper surface edge portion 116 and a sixth sub-upper surface edge portion 156.

The third upper surface edge portion 133 is connected to the first and second upper surface edge portions 131 and 132. The fourth upper surface edge portion 134 is spaced apart from the third upper surface edge portion 133 in the first direction DR1. The fourth upper surface edge portion 134 is connected to the first and second upper surface edge portions 131 and 132.

The flexible display panel 100 may include a first flexible display panel 110 and a second flexible display panel 150. The first and second flexible display panels 110 and 150 are connected to each other in the first direction DR1 (i.e., are oriented adjacent to each other in the first direction DR1).

The first flexible display panel 110 is kept inside the housing 300 (i.e., the first flexible display panel 110 remains inside the housing even after application of an external force to the flexible display panel 100). The first flexible display panel 110 is connected to the reel core 310 that is disposed in the housing 300, and is rolled or stretched around the reel core 310.

Figure 4A:
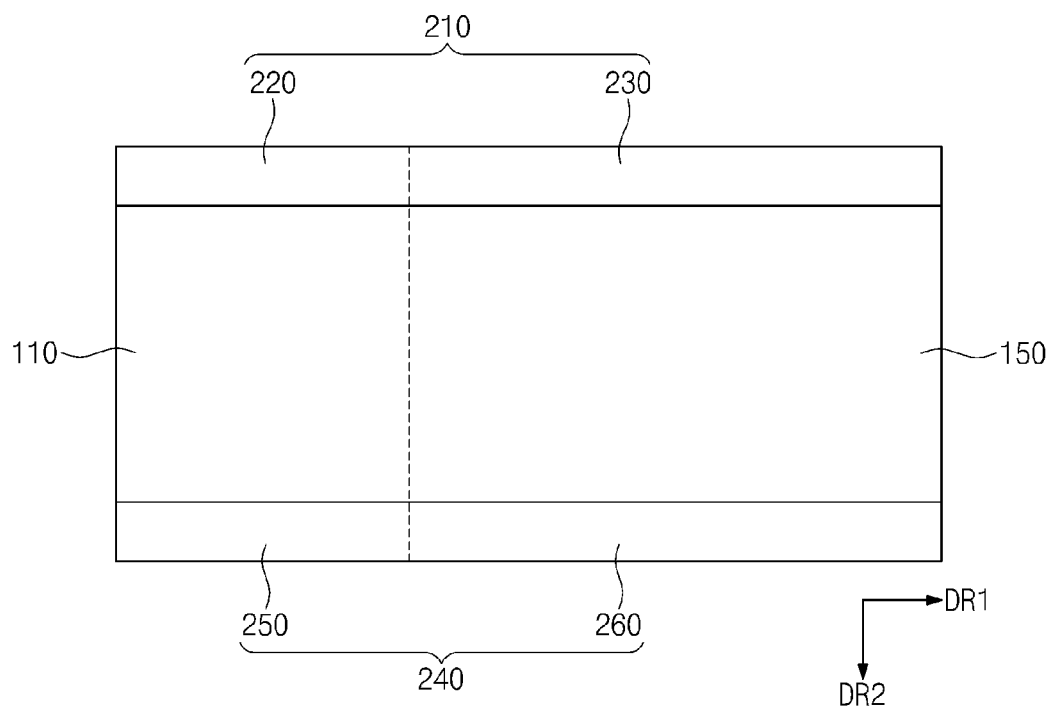
FIG. 4A is a plan view of a flexible display panel and a guide part of a rollable display device according to one or more embodiments of the present disclosure.
Figure 4B:
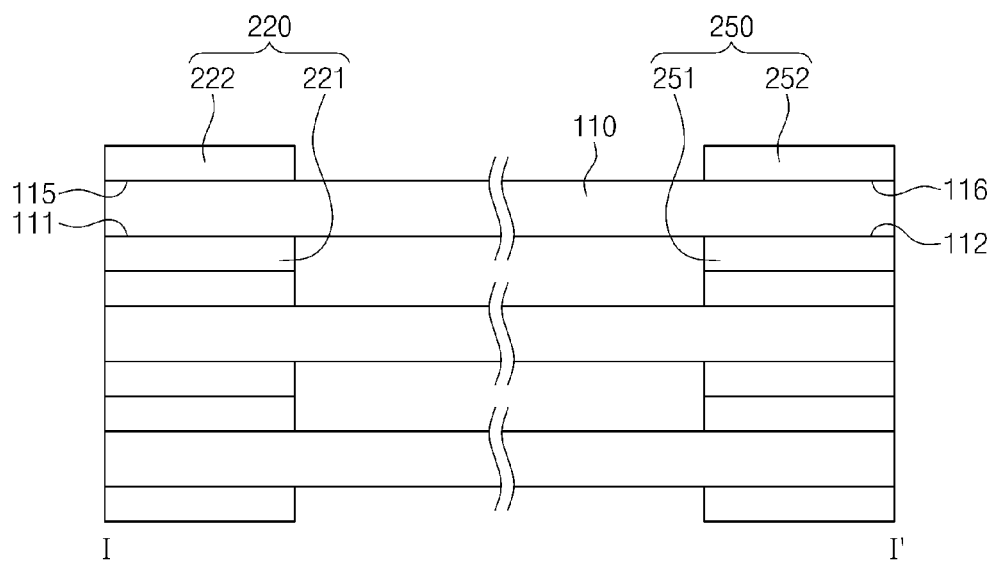
FIG. 4B is a cross-sectional view taken along the line I-I' of FIG. 1A.

As illustrated in FIG. 4B, first and second guide parts 220 and 250 are provided on respective edge portions of the first flexible display panel 110 (i.e., are provided on the first sub-lower surface edge portion 111, the first sub-upper surface edge portion 115, the second sub-lower surface edge portion 112, and the second sub-upper surface edge portion 116). The first and second guide parts 220 and 250 include first and second lower surface guide parts 221 and 251, respectively, and first and second upper guide parts 222 and 252, respectively. The second lower surface guide part 251 is spaced apart from the first lower surface guide part 221 in the second direction DR2. The first and second upper surface guide parts 222 and 252 are overlapped with the first and second lower surface guide parts 221 and 251, respectively (i.e., the first upper surface guide part 222 and the first lower surface guide part 221 are stacked in the third direction DR3 and the second upper surface guide part 252 and the second lower surface guide part 251 are stacked in the third direction DR3). The second upper surface guide part 252 is spaced apart from the first upper surface guide part 222 in the second direction DR2.

The first flexible display panel 110 includes a lower surface and an upper surface. The lower surface of the first flexible display panel 110 includes the first sub-lower surface edge portion 111, the second sub-lower surface edge portion 112, a third sub-lower surface edge portion 113, and a fourth sub-lower surface edge portion 114. The first and second lower surface guide parts 221 and 251 are provided on the first and second sub-lower surface edge portions 111 and 112, respectively. The upper surface of the first flexible display panel 110 includes the first sub-upper surface edge portion 115, the second sub-upper surface edge portion 116, a third sub-upper surface edge portion 117, and a fourth sub-upper surface edge portion 118. The first and second upper surface guide parts 222 and 252 are provided on the first and second sub-upper surface edge portions 115 and 116, respectively.

Each of the first sub-lower surface edge portion 111, the second sub-lower surface edge portion 112, the third sub-lower surface edge portion 113, and the fourth sub-lower surface edge portion 114 may have a substantially rectangular shape.

The first sub-lower surface edge portion 111 is overlapped with (or corresponds to) the non-display area NDA. The first lower surface guide part 221 is provided on the first sub-lower surface edge portion 111. The second sub-lower surface edge portion 112 is spaced apart from the first sub-lower surface edge portion 111 in the second direction DR2. The second sub-lower surface edge portion 112 is overlapped with (or corresponds to) the non-display area NDA. The second lower surface guide part 251 is provided on the second sub-lower surface edge portion 112.

The third sub-lower surface edge portion 113 is connected to the first sub-lower surface edge portion 111 and the second sub-lower surface edge portion 112. The third sub-lower surface edge portion 113 is overlapped with (or corresponds to) the non-display area NDA. The fourth sub-lower surface edge portion 114 is spaced apart from the third sub-lower surface edge portion 113 in the first direction DR1. The fourth sub-lower surface edge portion 114 is connected to the first sub-lower surface edge portion 111 and the second sub-lower surface edge portion 112. The fourth sub-lower surface edge portion 114 is overlapped with (or corresponds to) the display area DA.

Each of the first sub-upper surface edge portion 115, the second sub-upper surface edge portion 116, the third sub-upper surface edge portion 117, and the fourth sub-upper surface edge portion 118 may have a substantially rectangular shape.

The first sub-upper surface edge portion 115 is overlapped with (or corresponds to) the non-display area NDA. The first upper surface guide part 222 is provided on the first sub-upper surface edge portion 115. The second sub-upper surface edge portion 116 is spaced apart from the first sub-upper surface edge portion 115 in the second direction DR2. The second sub-upper surface edge portion 116 is overlapped with (or corresponds to) the non-display area NDA. The second upper surface guide part 252 is provided on the second sub-upper surface edge portion 116.

The third sub-upper surface edge portion 117 is connected to the first sub-upper surface edge portion 115 and the second sub-upper surface edge portion 116. The third sub-upper surface edge portion 117 is overlapped with (or corresponds to) the non-display area NDA. The fourth sub-upper surface edge portion 118 is spaced apart from the third sub-upper surface edge portion 117 in the first direction DR1. The fourth sub-upper surface edge portion 118 is connected to the first sub-upper surface edge portion 115 and the second sub-upper surface edge portion 116. The fourth sub-upper surface edge portion 118 is overlapped with (or corresponds to) the display area DA.

The second flexible display panel 150 is exposed to the outside of the housing 300 upon application of an external force to the flexible display panel 100. The second flexible display panel 150 is connected to the grip part 400. The second flexible display panel 150 is disposed between the first flexible display panel 110 and the grip part 400.

Figure 4C:
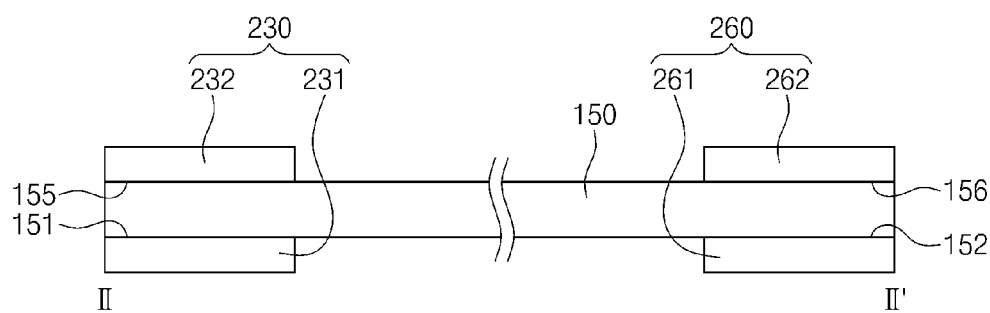
FIG. 4C is a cross-sectional view taken along the line II-II' of FIG. 1A.

As illustrated in FIG. 4C, third and fourth guide parts 230 and 260 are provided on respective edge portions of the second flexible display panel 150 (e.g., are provided on the fifth sub-lower surface edge portion 151, the fifth sub-upper surface edge portion 155, the sixth sub-lower surface edge portion 152, and the sixth sub-upper surface edge portion 156). The third and fourth guide parts 230 and 260 include third and fourth lower surface guide parts 231 and 261 and third and fourth upper guide parts 232 and 262, respectively. The fourth lower surface guide part 261 is spaced apart from the third lower surface guide part 231 in the second direction DR2. The third and fourth upper surface guide parts 232 and 262 are overlapped with the third and fourth lower surface guide parts 231 and 261, respectively. The fourth upper surface guide part 262 is spaced apart from the third upper surface guide part 232 in the second direction DR2.

The second flexible display panel 150 includes a lower surface and an upper surface. The lower surface of the second flexible display panel 150 includes the fifth sub-lower surface edge portion 151, the sixth sub-lower surface edge portion 152, a seventh sub-lower surface edge portion 153, and an eighth sub-lower surface edge portion 154. The third and fourth lower surface guide parts 231 and 261 are provided on the fifth sub-lower surface edge portion 151 and the sixth sub-lower surface edge portion 152, respectively. The upper surface of the second flexible display panel 150 includes the fifth sub-upper surface edge portion 155, the sixth sub-upper surface edge portion 156, a seventh sub-upper surface edge portion 157, and an eighth sub-upper surface edge portion 158. The third and fourth upper surface guide parts 232 and 262 are provided on the fifth and sixth sub-upper surface edge portions 155 and 156, respectively.

The fifth sub-lower surface edge portion 151, the sixth sub-lower surface edge portion 152, the seventh sub-lower surface edge portion 153, and the eighth sub-lower surface edge portion 154 each may have a substantially rectangular shape.

The fifth sub-lower surface edge portion 151 is overlapped with (or corresponds to) the non-display area NDA. The third lower surface guide part 231 is provided on the fifth sub-lower surface edge portion 151. The sixth sub-lower surface edge portion 152 is spaced apart from the fifth sub-lower surface edge portion 151 in the second direction DR2. The sixth sub-lower surface edge portion 152 is overlapped with (or corresponds to) the non-display area NDA. The fourth lower surface guide part 261 is provided on the sixth sub-lower surface edge portion 152.

The seventh sub-lower surface edge portion 153 is connected to the fifth sub-lower surface edge portion 151 and the sixth sub-lower surface edge portion 152. The seventh sub-lower surface edge portion 153 is overlapped with (or in) the display area DA. The eighth sub-lower surface edge portion 154 is spaced apart from the seventh sub-lower surface edge portion 153 in the first direction DR1. The eighth sub-lower surface edge portion 154 is connected to the fifth sub-lower surface edge portion 151 and the sixth sub-lower surface edge portion 152. The eighth sub-lower surface edge portion 154 is overlapped with (or corresponds to) the non-display area NDA.

The fifth sub-upper surface edge portion 155, the sixth sub-upper surface edge portion 156, the seventh sub-upper surface edge portion 157, and the eighth sub-upper surface edge portion 158 each may have a substantially rectangular shape.

The fifth sub-upper surface edge portion 155 is overlapped with (or corresponds to) the non-display area NDA. The third upper surface guide part 232 is provided on the fifth sub-upper surface edge portion 155. The sixth sub-upper surface edge portion 156 is spaced apart from the fifth sub-upper surface edge portion 155 in the second direction DR2. The sixth sub-upper surface edge portion 156 is overlapped with (or corresponds to) the non-display area NDA. The fourth upper surface guide part 262 is provided on the sixth sub-upper surface edge portion 156.

The seventh sub-upper surface edge portion 157 is connected to the fifth sub-upper surface edge portion 155 and the sixth sub-upper surface edge portion 156. The seventh sub-upper surface edge portion 157 is overlapped with (or in) the display area DA. The eighth sub-upper surface edge portion 158 is spaced apart from the seventh sub-upper surface edge portion 157 in the first direction DR1. The eighth sub-upper surface edge portion 158 is connected to the fifth sub-upper surface edge portion 155 and the sixth sub-upper surface edge portion 156. The eighth sub-upper surface edge portion 158 is overlapped with (or corresponds to) the non-display area NDA.

Figure 3A:
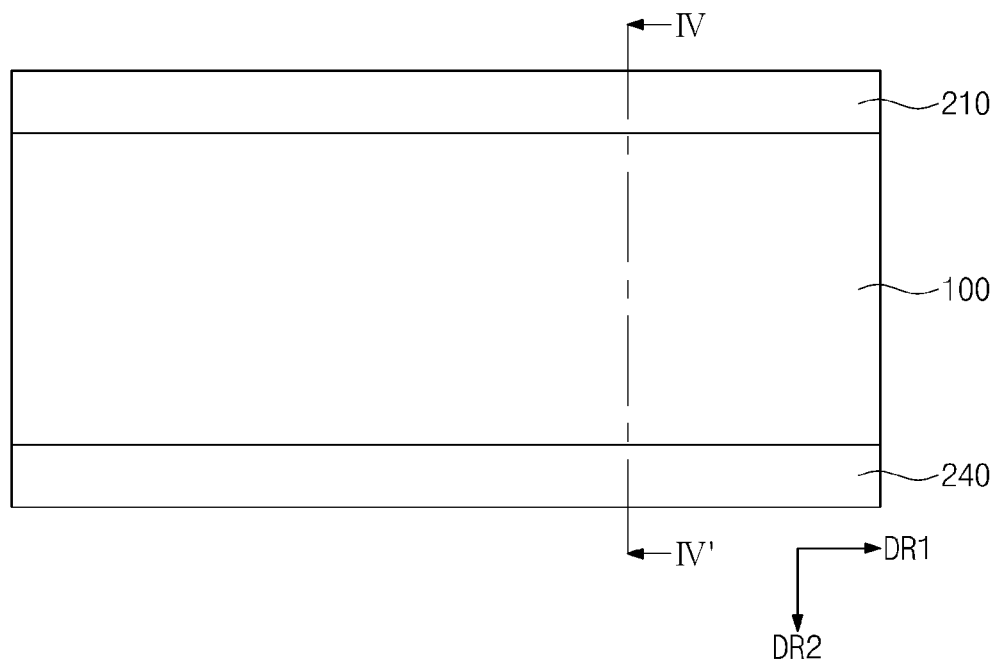
FIG. 3A is a plan view of a flexible display panel and a guide part of a rollable display device according to one or more embodiments of the present disclosure.
Figure 3B:
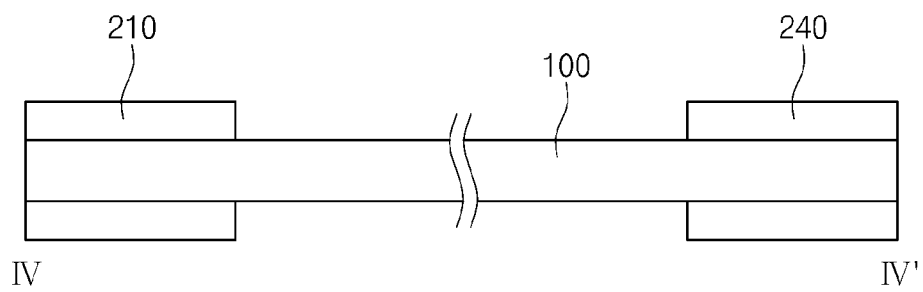
FIGS. 3B to 3G are cross-sectional views taken along the line IV-IV' of FIG. 3A.
Figure 3C:
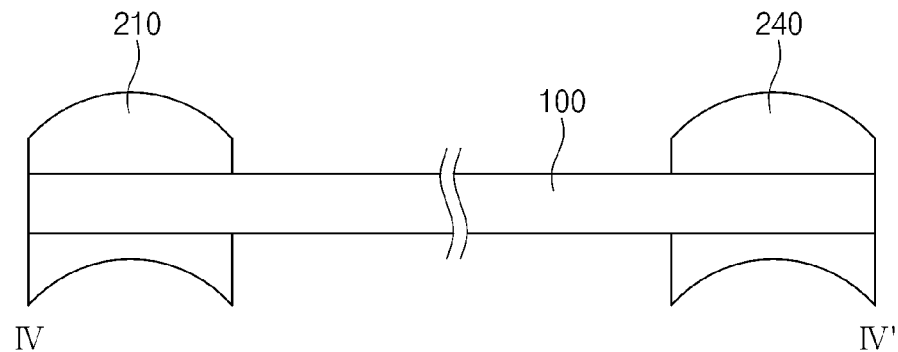
Figure 3D:
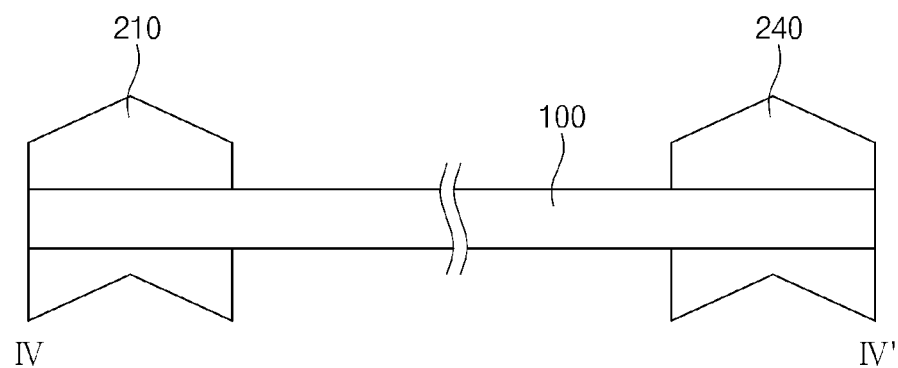
Figure 3E:
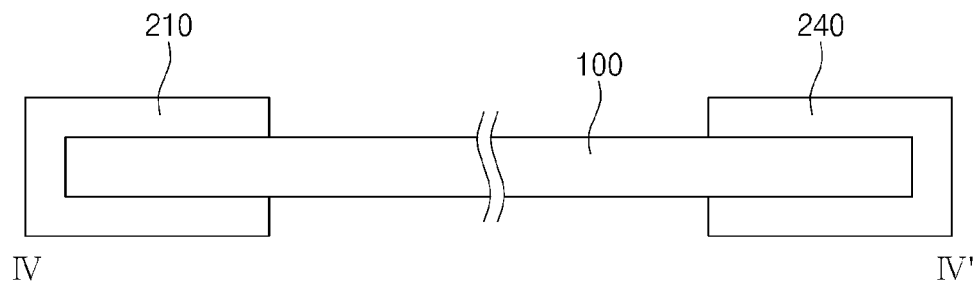
Figure 3F:
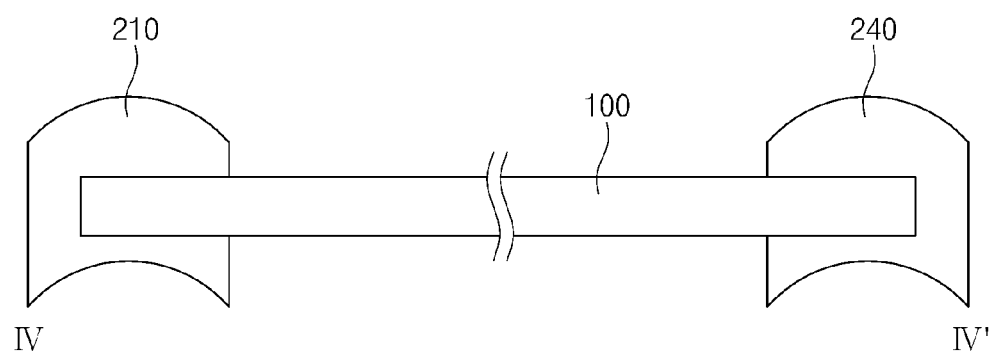
Figure 3G:
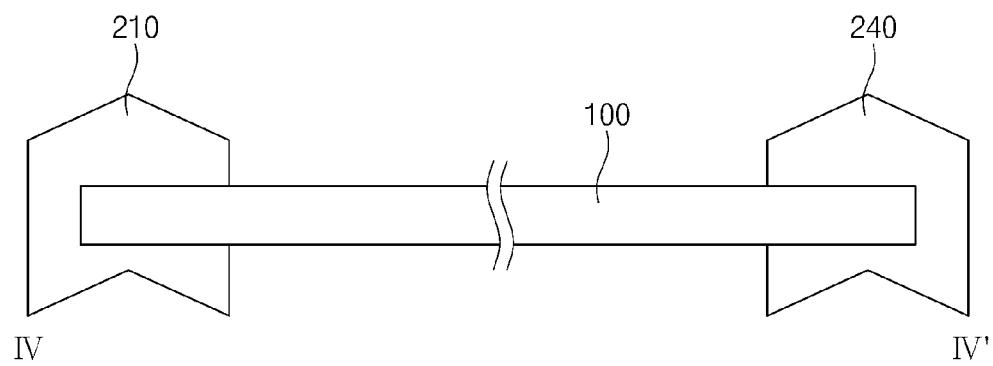

FIG. 3A is a plan view of a flexible display panel and a guide part of a rollable display device according to one or more embodiments of the present disclosure and FIGS. 3B to 3G are cross-sectional views taken along the line IV-IV' of FIG. 3A.

Referring to FIGS. 1A to 1D, 2A to 2E, and 3A, the guide part 200 is provided on edge portions of the flexible display panel 100. When the flexible display panel 100 is rolled inside the housing 300, the flexible display panel 100 may form a plurality of flexible display panel layers. The guide part 200 may allow the flexible display panel layers to be spaced apart from each other when the flexible display panel 100 is rolled inside the housing 300. When the guide part 200 and the flexible display panel 100 are rolled inside the housing 300, the guide part 200 forms a plurality of guide part layers that contact each other.

The guide part 200 may have various shapes, as shown in FIGS. 3B, 3C, 3D, 3E, 3F, and 3G, and may have any suitable shape provided that the display panel layers are spaced apart from each other when rolled inside the housing 300.

FIG. 4A is a plan view of a flexible display panel and a guide part of a rollable display device according to one or more embodiments of the present disclosure, FIG. 4B is a cross-sectional view taken along the line I-I' of FIG. 1A, and FIG. 4C is a cross-sectional view taken along the line II-II' of FIG. 1A.

FIG. 4B shows the flexible display panel 100 rolled inside the housing 300 to form three display panel layers, but the number of the display panel layers that are formed when the flexible display panel 100 is rolled inside the housing 300 is not limited thereto. For example, the flexible display panel 100 may form two, four, or more display panel layers when rolled inside the housing 300. In some embodiments, the flexible display panel 100 may form only one display panel layer when rolled inside the housing 300.

Referring to FIGS. 1A, 4A, 4B, and 4C, the guide part 200 is provided on edge portions of the flexible display panel 100 (i.e., is provided on the first lower surface edge portion 121, the first upper surface edge portion 131, the second lower surface edge portion 122, and the second upper surface edge portion 132. As discussed above, the guide part 200 includes the first, third, second, and fourth lower surface guide parts 221, 231, 251, and 261 and the first, third, second, and fourth upper surface guide parts 222, 232, 252, and 262. The first and third lower surface guide parts 221 and 231 are overlapped (or stacked) with the first lower surface edge portion 121 and the second and fourth lower surface guide parts 251 and 261 are overlapped (or stacked) with the second lower surface edge portion 122. The first and third upper surface guide parts 222 and 232 are overlapped (or stacked) with the first upper surface edge portion 131 and the first and third lower surface guide parts 221 and 231 and the second and fourth upper surface guide parts 252 and 262 are overlapped (or stacked) with the second upper surface edge portion 132 and the second and fourth lower surface guide parts 251 and 261. As illustrated in FIGS. 4B and 4C, an end (or edge) of the first, second, third, and fourth lower surface edge portions 121, 122, 123, and 124 and a respective end (or edge) of the first, second, third, and fourth upper surface edge portions 131, 132, 133, and 134 may be respectively aligned with a corresponding end (or edge) of the flexible display panel 100. However, the present disclosure is not limited thereto, and in some embodiments, at least one of the end of the first, second, third, and fourth lower surface edge portions 121, 122, 123, and 124, the respective end (or edge) of the first, second, third, and fourth upper surface edge portions 131, 132, 133, and 134, and the end (or edge) of the flexible display panel 100 may not be in alignment.

The guide part 200 includes a first guide part 210 and a second guide part 240. The first guide part 210 may be provided on the first lower surface edge portion 121 and the first upper surface edge portion 131. The second guide part 240 is provided on the second lower surface edge portion 122 and the second upper surface edge portion 132.

The first guide part 210 includes the first and third lower surface guide parts 221 and 231 and the first and third upper surface guide parts 222 and 232. The first and third lower surface guide parts 221 and 231 are overlapped with the first lower surface edge portion 121. The first lower surface guide part 221 is overlapped with the first sub-lower surface edge portion 111. The third sub-lower surface guide part 231 is connected to the first lower surface guide part 221. The third lower surface guide part 231 is overlapped with the fifth sub-lower surface edge portion 151.

The first and third upper surface guide parts 222 and 232 are overlapped with the first upper surface edge portion 131. The first upper surface guide part 222 is overlapped with the first sub-upper surface edge portion 115 and the first lower surface guide part 221. The third upper surface guide part 232 is connected to the first upper surface guide part 222. The third upper surface guide part 232 is overlapped with the fifth sub-upper surface edge portion 155 and the third lower surface guide part 231.

The second guide part 240 includes the second and fourth lower surface guide parts 251 and 261 and the second and fourth upper surface guide parts 252 and 262. The second and fourth lower surface guide parts 251 and 261 are overlapped with the second lower surface edge portion 122. The second lower surface guide part 251 is overlapped with the second sub-lower surface edge portion 112. The fourth lower surface guide part 261 is connected to the second lower surface guide portion 251. The fourth lower surface guide part 261 is overlapped with the sixth sub-lower surface edge portion 152.

The second and fourth upper surface guide parts 252 and 262 are overlapped with the second upper surface edge portion 132. The second upper guide part 252 is overlapped with the second sub-upper surface edge portion 116 and the second lower surface guide part 251. The fourth upper surface guide part 262 is connected to the second upper surface guide part 252. The fourth upper surface guide part 262 is overlapped with the sixth sub-upper surface edge portion 156 and the fourth lower surface guide portion 261.

Figure 5A:
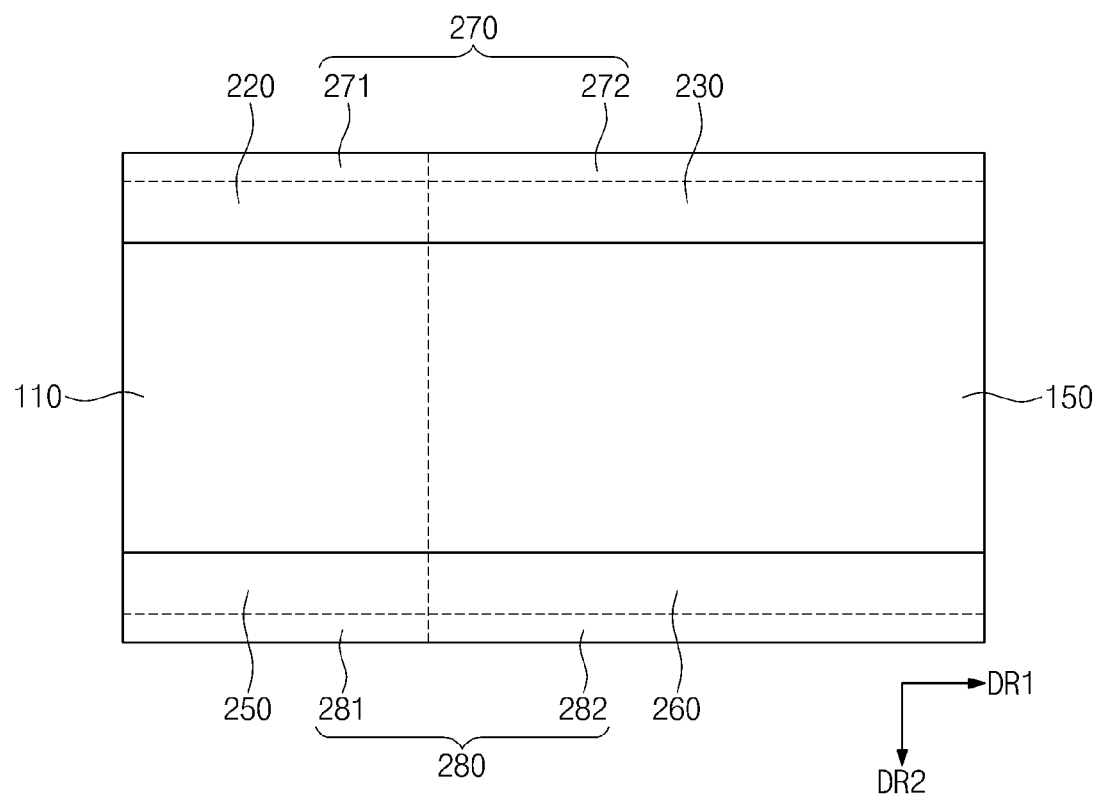
FIG. 5A is a plan view of a flexible display panel and a guide part of a rollable display device according to one or more embodiments of the present disclosure.
Figure 5B:
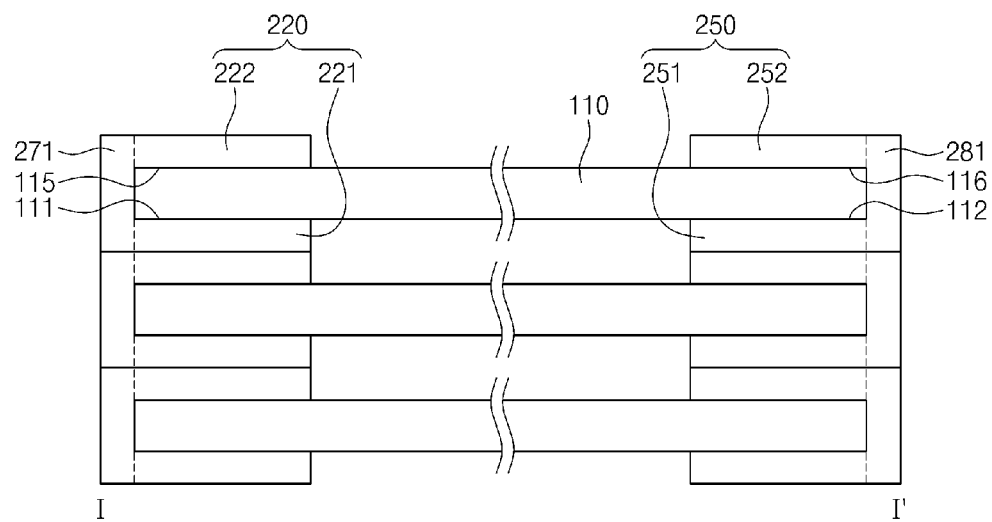
FIG. 5B is a cross-sectional view taken along the line I-I' of FIG. 1C.
Figure 5C:
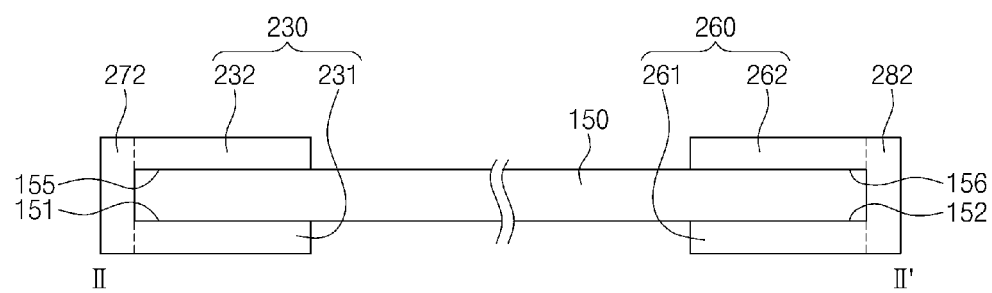
FIG. 5C is a cross-sectional view taken along the line II-II' of FIG. 1C.
Figure 5D:
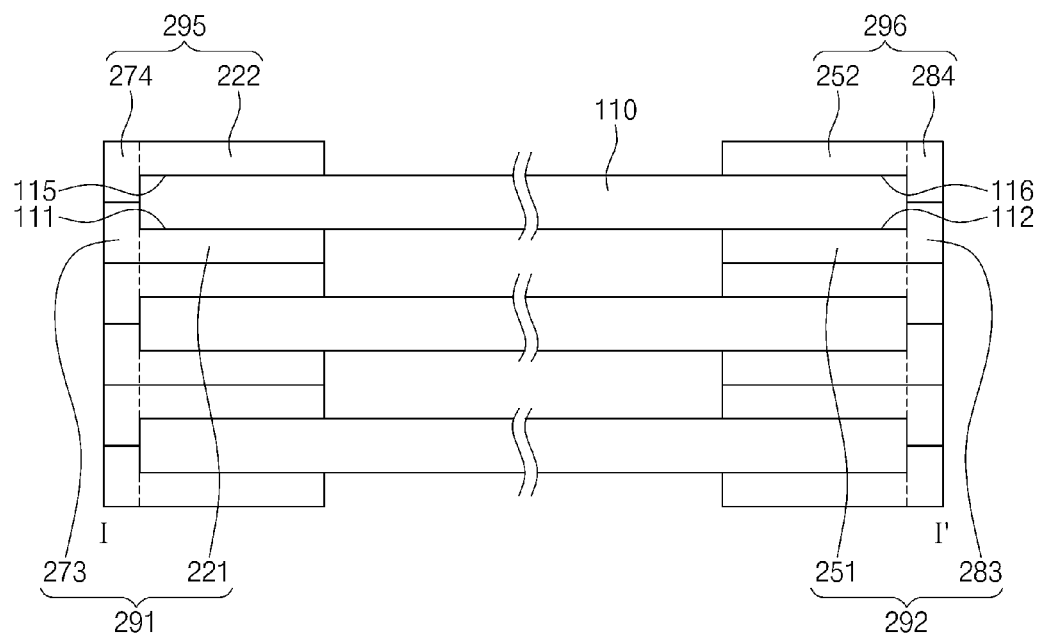
FIG. 5D is a cross-sectional view taken along the line I-I' of FIG. 1C.
Figure 5E:
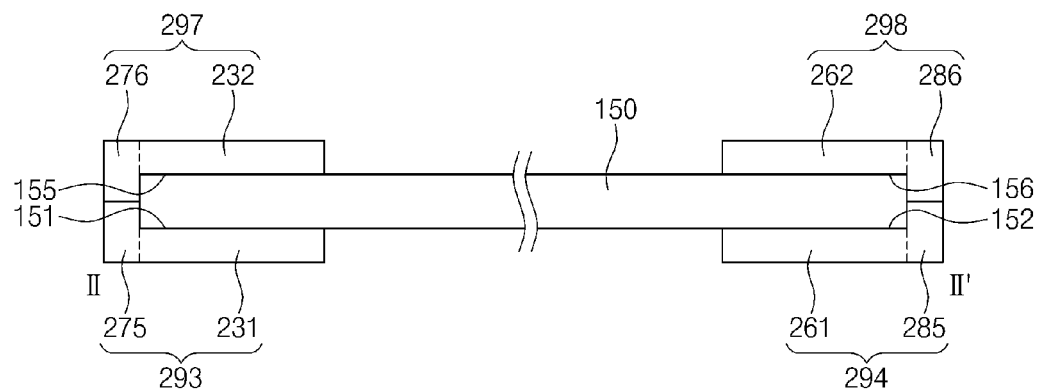
FIG. 5E is a cross-sectional view taken along the line II-II' of FIG. 1C.

FIG. 5A is a plan view of a flexible display panel and a guide part of a rollable display device according to one or more embodiments of the present disclosure, FIG. 5B is a cross-sectional view taken along the line I-I' of FIG. 1C, FIG. 5C is a cross-sectional view taken along the line II-II' of FIG. 1C, FIG. 5D is a cross-sectional view taken along a line I-I' of FIG. 1C, and FIG. 5E is a cross-sectional view taken along the line II-II' of FIG. 1C.

FIGS. 5B and 5D show the flexible display panel 100 rolled inside the housing 300 to form three display panel layers, but the number of the display panel layers is not limited thereto. For example, when the flexible display panel 100 is rolled inside the housing 300, the flexible display panel 100 may form two, four, or more display panel layers.

In some embodiments, the flexible display panel 100 may form only one display panel layer when it is rolled inside the housing 300.

Referring to FIGS. 1C and 5A to 5E, the guide part 200 may further include first and second side surface guide parts 270 and 280. The first side surface guide part 270 connects the first and third lower surface guide parts 221 and 231 and the first and third upper surface guide parts 222 and 232 and the second side surface guide part 280 connects the second and fourth lower surface guide parts 251 and 261 and the second and fourth upper surface guide parts 252 and 262. The first and second side surface guide parts 270 and 280 each cover a side surface of the flexible display panel 100. The first and second side surface guide parts 270 and 280 may be integrally formed with the respective first, third, second, and fourth lower surface guide parts 221, 231, 251, and 261 and the first, third, second, and fourth upper surface guide parts 222, 232, 252, and 262 or may be laminated on the respective first, third, second, and fourth lower surface guide parts 221, 231, 251, and 261 and the first, third, second, and fourth upper surface guide parts 222, 232, 252, and 262 after being separately formed.

The first side surface guide part 270 includes a first sub-side surface guide part 271 and a third sub-side surface guide part 272 and the second side surface guide part 280 includes a second sub-side surface guide part 281 and a fourth sub-side surface guide part 282. The first and third sub-side surface guide parts 271 and 272 respectively connect the first and third lower surface guide parts 221 and 231, that are overlapped with the first lower surface edge portion 121, and the first and third upper surface guide parts 222 and 232, that are overlapped with the first upper surface edge portion 131. The first sub-side surface guide part 271 connects the first lower surface guide part 221, that is overlapped with the first sub-lower surface edge portion 111, and the first upper surface guide part 222, that is overlapped with the first sub-upper surface edge portion 115. The third sub-side surface guide part 272 is connected to the first sub-side surface guide part 271. The third sub-side surface guide part 272 connects the third lower surface guide part 231, that is overlapped with the fifth sub-lower surface edge portion 151, and the third upper surface guide part 232, that is overlapped with the fifth sub-upper surface edge portion 155.

The second and fourth sub-side surface guide parts 281 and 282 respectively connect the second and fourth lower surface guide parts 251 and 261, that are overlapped with the second lower surface edge portion 122, and the second and fourth upper surface guide parts 252 and 262, that are overlapped with the second upper surface edge portion 132. The second sub-side surface guide part 281 connects the second lower surface guide part 251, that is overlapped with the second sub-lower surface edge portion 112, and the second upper surface guide part 252, that is overlapped with the second sub-upper surface edge portion 116. The fourth sub-side surface guide part 282 is connected to the second sub-side surface guide part 281. The fourth sub-side surface guide part 282 connects the fourth lower surface guide part 261, that is overlapped with the sixth sub-lower surface edge portion 152, and the fourth upper surface guide part 262, that is overlapped with the sixth sub-upper surface edge portion 156.

Referring to FIGS. 1C, 5A, 5D, and 5E, the guide part 200 includes a first lower guide part 291, a second lower guide part 292, a third lower guide part 293, and a fourth lower guide part 294 and a first upper guide part 295, a second upper guide part 296, a third upper guide part 297, and a fourth upper guide part 298. The first, second, third, and fourth lower guide parts 291, 292, 293, and 294 respectively include the first, third, second, and fourth lower surface guide parts 221, 231, 251, and 261 and first, third, second, and fourth lower side surface guide parts 273, 275, 283, and 285. The first, third, second, and fourth lower side surface guide parts 273, 275, 283, and 285 are respectively connected to the first, third, second, and fourth lower surface guide parts 221, 231, 251, and 261. The first, second, third, and fourth upper guide parts 295, 296, 297, and 298 respectively include the first, third, second, and fourth upper surface guide parts 222, 232, 252, and 262 and first, third, second, and fourth upper side surface guide parts 274, 276, 284, and 286. The first, third, second, and fourth upper side surface guide parts 274, 276, 284, and 286 are respectively connected to the first, third, second, and fourth upper surface guide parts 222, 232, 252, and 262. The first side surface guide part 270 includes the first and third lower side surface guide parts 273 and 275 and the first and third upper side surface guide parts 274, and 276 and the second side guide part 280 includes the second and fourth lower surface guide parts 283 and 285 and the second and fourth upper side surface guide parts 284 and 286. FIGS. 5D and 5E show the first, third, second, and fourth lower surface guide portions 221, 231, 251, and 261 integrally formed with the first, third, second, and fourth lower side surface guide parts 273, 275, 283, and 285, respectively, and the first, third, second, and fourth upper surface guide portions 222, 232, 252, and 262 integrally formed with the first, third, second, and fourth upper side surface guide parts 274, 276, 284, and 286, respectively. However, the first, third, second, and fourth lower guide parts 221, 231, 251, and 261 and the first, third, second, and fourth lower side surface guide parts 273, 275, 283, and 285 may be formed separately and respectively laminated to each other and the first, third, second, and fourth upper guide parts 222, 232, 252, and 262 and the first, third, second, and fourth upper side surface guide parts 274, 276, 284, and 286 may be formed separately and respectively laminated to each other.

The first and third lower guide parts 291 and 293 may be disposed adjacent to the first lower surface edge portion 121 of the flexible display panel 100 and the second and fourth lower guide parts 292 and 294 may be disposed adjacent to the second lower surface edge portion 122 of the flexible display panel 100. The first and third lower guide parts 291 and 293 respectively include the first and third lower surface guide parts 221 and 231 and the first and third lower side surface guide parts 273 and 275 respectively connected to the first and third lower surface guide parts 221 and 231. The first lower guide part 291 may be disposed adjacent to the first sub-lower surface edge portion 111 of the first flexible display panel 110 the third lower guide part 293 may be disposed adjacent to the fifth sub-lower surface edge portion 151 of the second flexible display panel 150. The first lower guide part 291 includes the first lower surface guide part 221 and the first lower side surface guide part 273 connected to the first lower surface guide portion 221. The third lower guide part 293 includes the third lower surface guide part 231 and the third lower side surface guide part 275 connected to the third lower surface guide part 231.

The second and fourth lower guide parts 292 and 294 respectively include the second and fourth lower surface guide parts 251 and 261 and the second and fourth lower side surface guide parts 283 and 285 respectively connected to the second and fourth lower surface guide parts 251 and 261. The second lower guide part 292 may be disposed adjacent to the second sub-lower surface edge portion 112 of the first flexible display panel 110 and the fourth lower guide part 294 may be disposed adjacent to the sixth sub-lower surface edge portion 152 of the second flexible display panel 150. The second lower guide part 292 includes the second lower surface guide part 251 and the second lower side surface guide part 283 connected to the second lower surface guide portion 251. The fourth lower guide part 294 includes the fourth lower surface guide part 261 and the fourth lower side surface guide part 285 connected to the fourth lower surface guide part 261.

The first and second lower guide parts 291 and 292 may be disposed adjacent to the first and second sub-lower surface edge portions 111 and 112 of the first flexible display panel 110, respectively, and the third and fourth lower guide parts 293 and 294 may be disposed adjacent to the fifth and sixth sub-lower surface edge portions 151 and 152 of the second flexible display panel 150, respectively.

The first and third upper guide parts 295 and 297 may be disposed adjacent to the first upper surface edge portion 131 of the first flexible display panel 110 and second and fourth upper guide parts 296 and 298 may be disposed adjacent to the second upper surface edge portion 132 of the second flexible display panel 150. The first and third upper guide parts 295 and 297 respectively include first and third upper surface guide parts 222 and 232 and first and third upper side surface guide parts 274 and 276 connected to the first and third upper surface guide parts 222 and 232. The first upper guide part 295 may be disposed adjacent to the first sub-upper edge portion 115 of the first flexible display panel 110 and the third upper guide part 297 may be disposed adjacent to the fifth sub-upper surface edge portion 155 of the second flexible display panel 150. The first upper guide part 295 includes a first upper surface guide part 222 and a first upper side surface guide part 274 connected to the first upper surface guide part 222. The third upper guide part 297 includes a third upper surface guide part 232 and a third upper side surface guide part 276 connected to the third upper surface guide part 232.

The second and fourth upper guide parts 296 and 298 respectively include second and fourth upper surface guide parts 252 and 262 and second and fourth upper side surface guide parts 284 and 286 respectively connected to the second and fourth upper surface guide parts 252 and 262. The second upper guide part 296 may be disposed adjacent to the second sub-upper surface edge portion 116 of the first flexible display panel 110 and the fourth upper guide part 298 may be disposed adjacent to the sixth sub-upper surface edge portion 156 of the second flexible display panel 150. The second upper guide part 296 includes the second upper surface guide part 252 and the second upper side surface guide part 284 connected to the second upper surface guide part 252. The fourth upper guide part 298 includes the fourth upper surface guide part 262 and the fourth upper side surface guide part 286 connected to the fourth upper surface guide part 262.

The first and second upper guide parts 295 and 296 may be disposed adjacent to the first and second sub-upper surface edge portions 115 and 116 of the first flexible display panel 110, respectively, and the third and fourth upper guide parts 297 and 298 may be disposed adjacent to the fifth and sixth sub-upper surface edge portions 155 and 156 of the second flexible display panel 150, respectively.

Figure 6A:
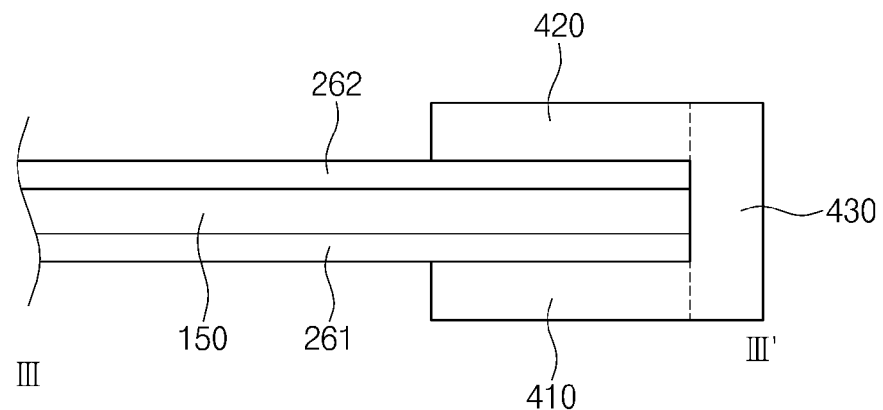
FIGS. 6A and 6B are cross-sectional views taken along the line III-III' of FIG. 1B.
Figure 6B:
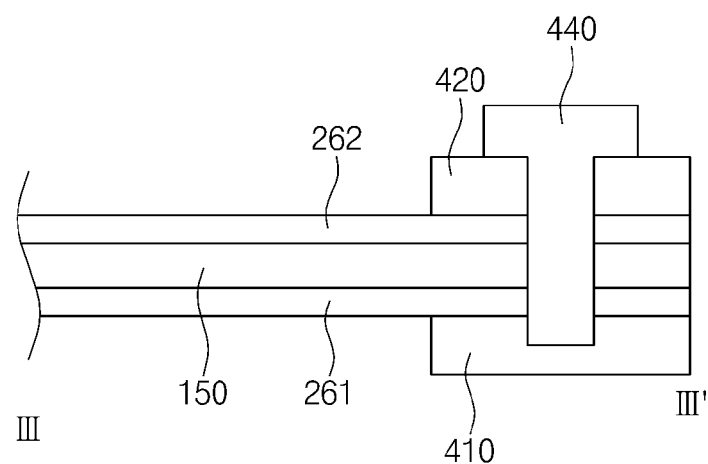

FIGS. 6A and 6B are cross-sectional views taken along the line III-III' of FIG. 1B.

Referring to FIGS. 1A to 1D, 6A, and 6D, the grip part 400 may be connected to the flexible display panel 100. The grip part 400 may be connected to the guide part 200. When an external force is applied to the grip part 400 (e.g., when the grip part 400 is pulled by a user), the flexible display panel 100 may be exposed to the outside of the housing 300.

The grip part 400 includes an upper grip part 420 and a lower grip part 410. The upper grip part 420 may be disposed on the guide part 200 and the flexible display panel 100 and overlapped with at least a portion of the guide part 200 and at least a portion of the flexible display panel 100. The lower grip part 410 may be disposed under the guide part 200 and the flexible display panel 100 and overlapped with at least a portion of the guide part 200 and at least a portion of the flexible display panel 100. As illustrated in FIGS. 6A and 6B, an end of the flexible display panel 100, an end of the upper grip part 420, and an end of the lower grip part 410 may be in alignment with each other, but the present disclosure is not limited thereto. For example, at least one of the end of the flexible display panel 100, the end of the upper grip part 420, and the end of the lower grip part 410 may not be in alignment with the others.

Referring to FIG. 6A, the grip part 400 further includes a side grip part 430. The side grip part 430 covers a side surface of the guide part 200 and a side surface of the flexible display panel 100, and is connected to the upper and lower grip parts 420 and 410.

Referring to FIG. 6B, the rollable display device 10 may further include a fixing screw 440. The fixing screw 440 connects the upper and lower grip parts 420 and 410 and fixes (or attaches or securely attaches) the upper and lower grip parts 420 and 410 to each other. The fixing screw 440 penetrates through an upper through-hole formed through the upper grip part 420 and a panel through-hole formed through the flexible display panel 100, and then the fixing screw 440 is engaged with a lower recess formed in the lower grip part 410. Accordingly, the upper grip part 420, the flexible display panel 100, and the lower grip part 410 are fixed to each other, but the present disclosure is not limited thereto. For example, the lower grip part 410 may include a lower through-hole formed through the lower grip part 410 and the fixing screw 440 may sequentially penetrate through the upper through-hole, the panel through-hole, and the lower through-hole and fix the upper grip part 420, the flexible display part 100, and the lower grip part 410 to each other.

As illustrated in FIG. 6B, the fixing screw 440 may penetrate through the panel through-hole of the flexible display panel 100, but the fixing screw 440 may penetrate through a through-hole formed through the guide part 200 in one or more embodiments.

The rollable display device 10 may further include a touch screen panel and a window member. The touch screen panel may be disposed on the image display part and the window member may be disposed on the touch screen panel. The touch screen panel may sense a position at which a touch event occurs and the window member protects the touch screen panel.

In a rollable display device that includes only a flexible display panel without including a guide part, when the flexible display panel is rolled inside the housing and forms a plurality of display panel layers, the display panel layers contact each other. When the flexible display panel is rolled or stretched, a defect or defects, e.g., a scratch, may occur on the display panel layer because the display panel layers contact each other. These defects may result in malfunctioning pixels in an area of the display panel having the defect. As a result, the image is not clearly displayed in the malfunctioning pixels and the display quality of the flexible display panel 100 is deteriorated.

In the rollable display device 10 according to one or more embodiments of the present disclosure, the rollable display device 10 includes the flexible display panel 100 and the guide part 200, and thus, when the flexible display panel 100 is rolled inside the housing and forms a plurality of display panel layers, the display panel layers are spaced apart from each other. Therefore, a defect or defects, such as a scratch, may be prevented from occurring on the display panel layers because the display panel layers are spaced apart from each other when the flexible display panel is rolled inside the housing. Thus, the rollable display device 10 including the flexible display panel 100 and the guide part 200 may prevent the defects from occurring in pixels of the flexible display panel 100 and improve the display quality thereof.

Hereinafter, a method of manufacturing the rollable display device 10 is described.

Figure 7:
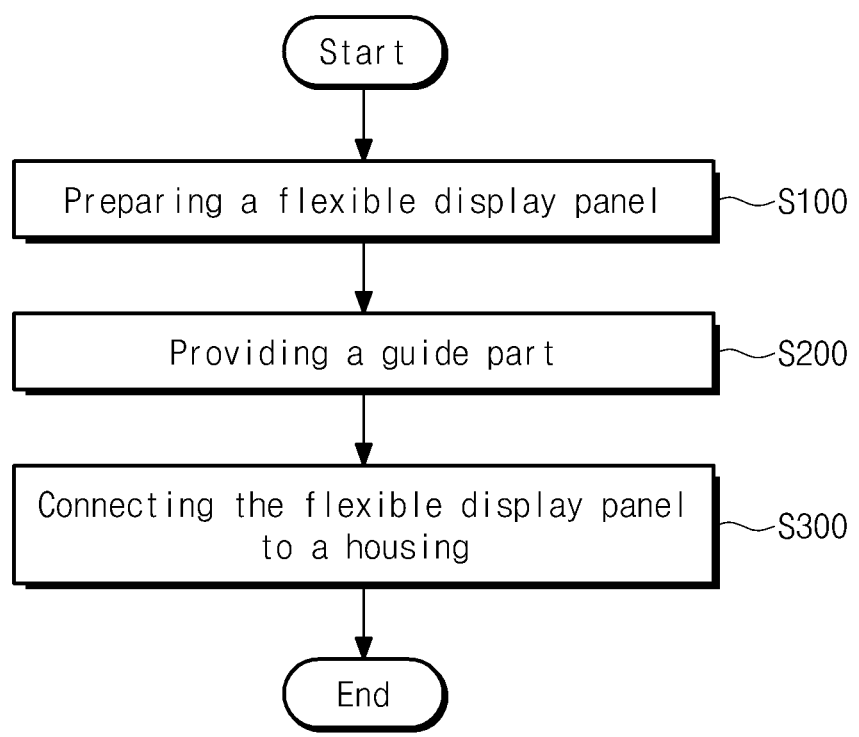
FIG. 7 is a flowchart of a method of manufacturing a rollable display device according to one or more embodiments of the present disclosure.

FIG. 7 is a flowchart of a method of manufacturing a rollable display device according to one or more embodiments of the present disclosure.

Referring to FIGS. 1A to 1D, 2A to 2C, 3A, 3B, 4A to 4C, and 7, the method of manufacturing the rollable display device 10 includes a step S100 of preparing the flexible display panel 100, a step S200 of providing the guide part 200 at edge portions of the flexible display panel 100, and a step S300 of connecting the flexible display panel 100 to the housing 300. The step S200 of providing the guide part 200 includes providing the guide part 200 that prevents (or reduces or minimizes the likelihood of) the display panel layers that are formed when the flexible display panel 100 is rolled inside the housing 300 from contacting each other.

The flexible display panel 100 includes edge portions at which the guide part 200 is provided. The flexible display panel 100 includes the lower surface 120 and the upper surface 130. The lower surface 120 of the flexible display panel 100 includes the first lower surface edge portion 121, the second lower surface edge portion 122, the third lower surface edge portion 123, and the fourth lower surface edge portion 124. The upper surface 130 of the flexible display panel 100 includes the first upper surface edge portion 131, the second upper surface edge portion 132, the third upper surface edge portion 133, and the fourth upper surface edge portion 134. The guide part 200 is provided at (or on) the first lower and upper surface edge portions 121, 122, and the second lower and upper surface edge portions 131, and 132.

The first, second, third, and fourth lower surface edge portions 121, 122, 123, and 124 are overlapped with (or correspond to) the non-display area NDA.

The first, second, third, and fourth upper surface edge portions 131, 132, 133, and 134 are overlapped with (or correspond to) the non-display area NDA.

The step S200 of providing the guide part 200 includes providing the first, third, second, and fourth lower surface guide parts 221, 231, 251, and 261 on the first, second, third, and fourth lower surface edge portions 121, 122, 123, 124, of the lower surface 120 of the flexible display panel 100, respectively, and providing the first, third, second, and fourth upper surface guide parts 222, 232, 252, and 262 on the first, second, third, and fourth upper surface edge portions 131, 132, 133, 134 of the upper surface 130 of the flexible display panel 100, respectively.

Figure 8A:
FIGS. 8A and 8B are plan views of a portion of a method of manufacturing a rollable display device according to one or more embodiments of the present disclosure.
Figure 8B:
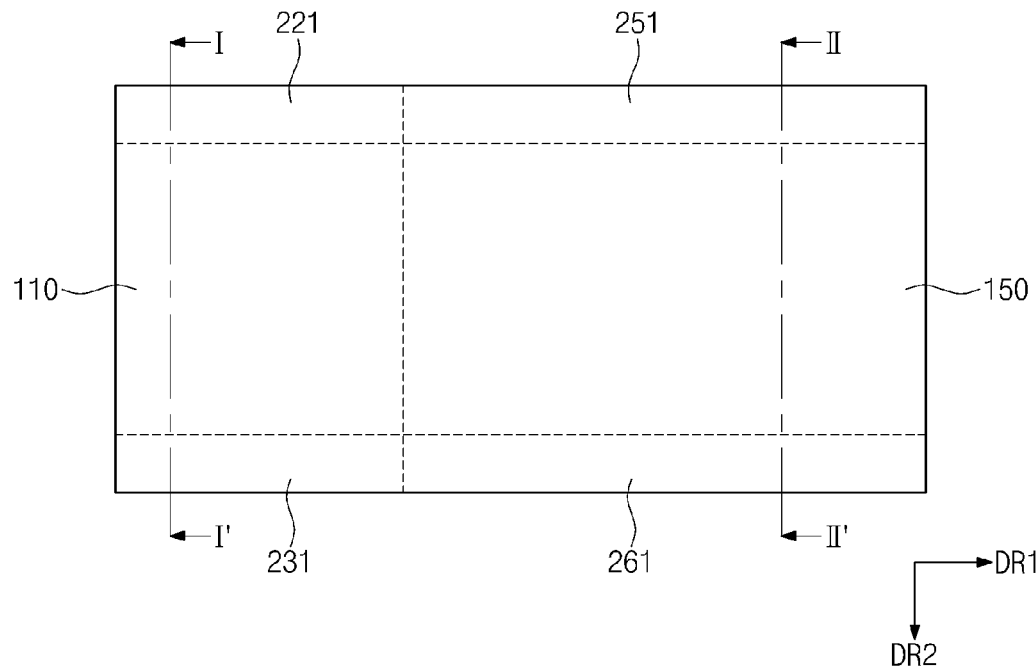
Figure 8C:
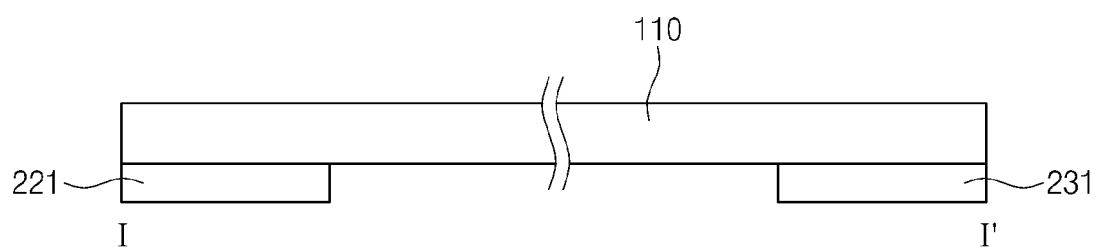
FIG. 8C is a cross-sectional view taken along the line I-I' of FIG. 8B.
Figure 8D:
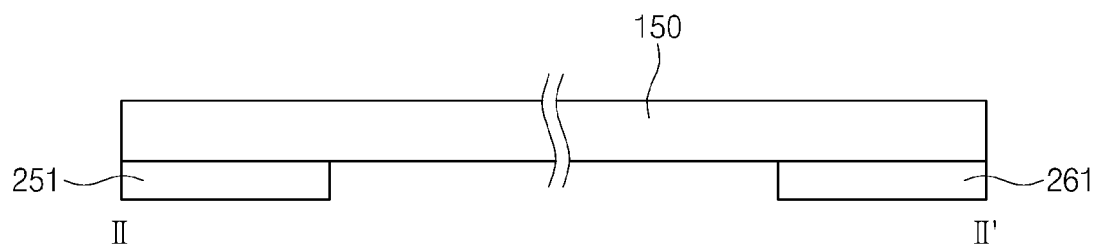
FIG. 8D is a cross-sectional view taken along the line II-II' of FIG. 8B.

FIGS. 8A and 8B are plan views of a portion of a method of manufacturing a rollable display device according to one or more embodiments of the present disclosure, FIG. 8C is a cross-sectional view taken along the line I-I' of FIG. 8B, and FIG. 8D is a cross-sectional view taken along the line II-II' of FIG. 8B.

Referring to FIGS. 1A to 1D, 2A to 2E, 3A, 3B, 4A to 4C, 7, and 8A to 8D, the flexible display panel 100 is prepared in the step S100. The flexible display panel 100 includes the first flexible display panel 110 and the second flexible display panel 150. The first and second flexible display panels 110 and 150 are connected to each other in the first direction DR1 (i.e., are oriented adjacent to each other in the first direction DR1).

The first flexible display panel 110 may be rolled and kept inside the housing 300 (i.e., the first flexible display panel 110 remains inside the housing even after application of an external force to the flexible display panel 100). For example, the first flexible display panel 110 may be connected to the reel core 310, and then rolled or stretched.

The second flexible display panel 150 is exposed to the outside of the housing 300 upon application of an external force. The second flexible display panel 150 is connected to the grip part 400. The second flexible display panel 150 is disposed between the first flexible display panel 110 and the grip part 400.

The first, third, second, and fourth lower surface guide parts 221, 231, 251, and 261 are provided on the first, second, third, and fourth lower surface edge portions 121, 122, 123, and 124 on the lower surface 120 of the prepared flexible display panel 100, respectively. The first and second lower surface guide parts 221 and 251 are provided on the first and second lower surface edge portions 111 and 112 of the first flexible display panel 110, respectively.

The second and fourth lower surface guide parts 231 and 261 are provided on the fifth and sixth sub-lower surface edge portions 151 and 152 of the second flexible display panel 150, respectively.

Figure 8E:
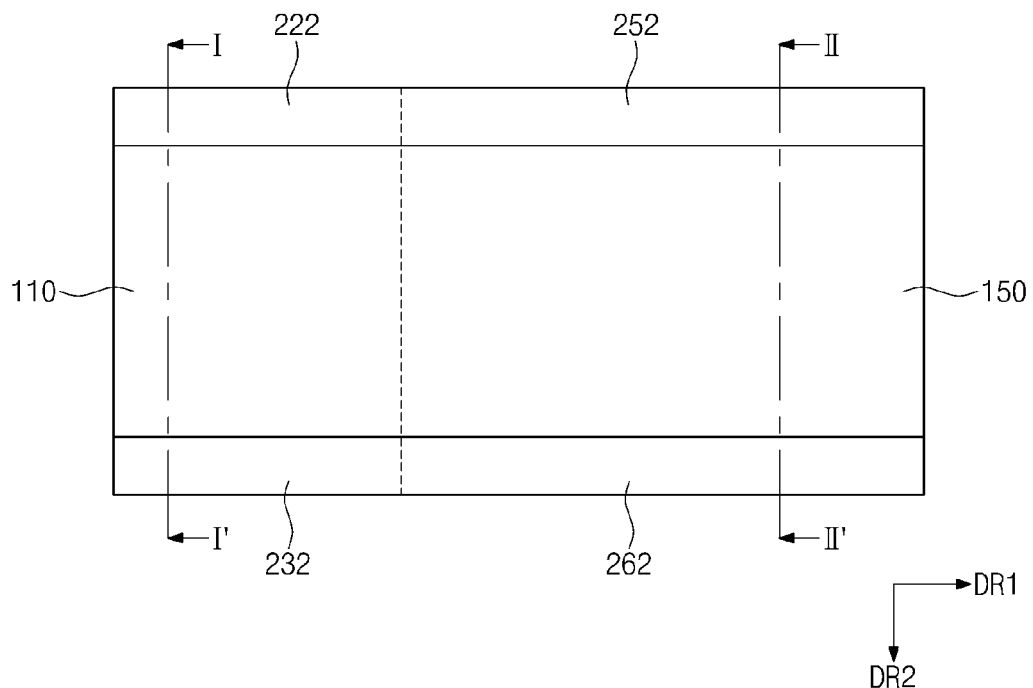
FIG. 8E is a plan view of a portion of a method of manufacturing a rollable display device according to one or more embodiments of the present disclosure.
Figure 8F:
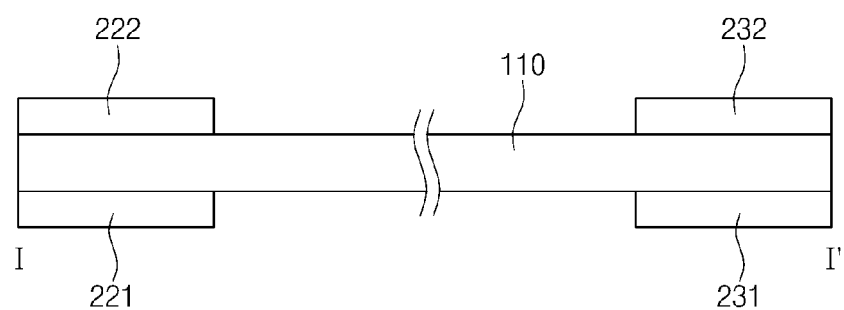
FIG. 8F is a cross-sectional view taken along the line I-I' of FIG. 8E.
Figure 8G:
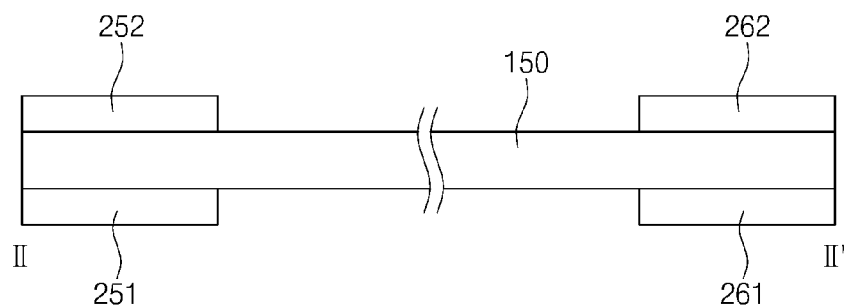
FIG. 8G is a cross-sectional view taken along the line II-II' of FIG. 8E.

FIG. 8E is a plan view of a portion of a method of manufacturing a rollable display device according to one or more embodiments of the present disclosure, FIG. 8F is a cross-sectional view taken along the line I-I' of FIG. 8E, and FIG. 8G is a cross-sectional view taken along the line II-II' of FIG. 8E.

Referring to FIGS. 1A to 1D, 2A to 2E, 3A, 3B, 4A to 4C, 7, and 8E to 8G, the first, third, second and fourth upper surface guide parts 222, 232, 252, and 262 are provided on the first, second, third, and fourth upper surface edge portions 131, 132, 133, and 134 included in the upper surface 130 of the flexible display panel 100, respectively. The first, second, third, and fourth upper surface edge portions 131, 132, 133, and 134 are overlapped (or stacked) with the first, third, second, and fourth lower surface guide parts 221, 231, 251, and 261, respectively.

The first and second upper surface guide parts 222 and 252 are provided on the first and second sub-upper surface edge portions 115 and 116 of the first flexible display panel 110, respectively.

The third and fourth upper surface guide parts 232 and 262 are provided on the fifth and sixth sub-upper surface edge portions 155 and 156 of the second flexible display panel 150, respectively.

Figure 8H:
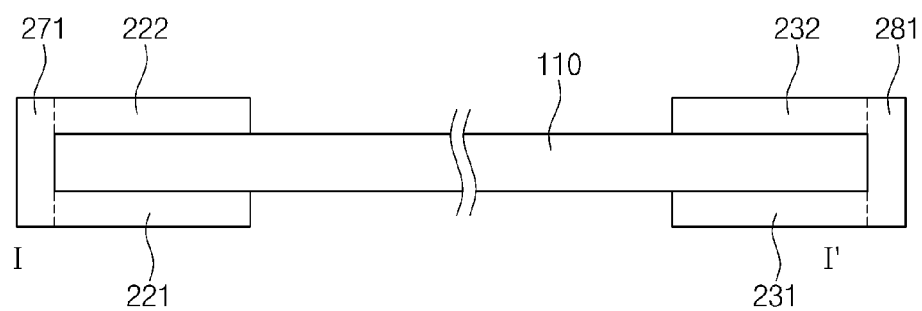
FIG. 8H is a cross-sectional view taken along the line I-I' of FIG. 8E.
Figure 8I:
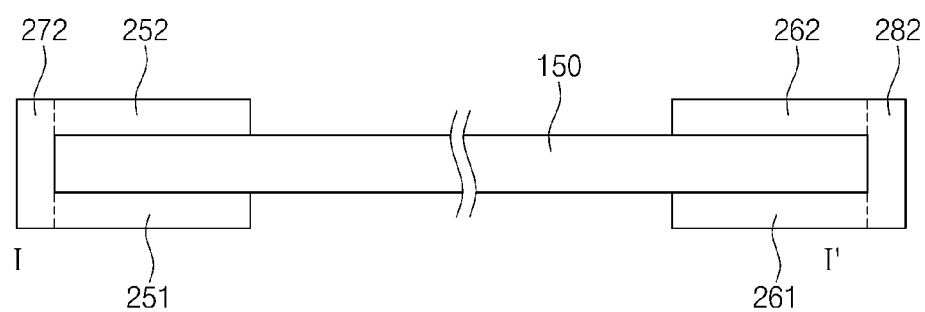
FIG. 8I is a cross-sectional view taken along the line II-II' of FIG. 8E.

FIG. 8H is a cross-sectional view taken along the line I-I' of FIG. 8E and FIG. 8I is a cross-sectional view taken along the line II-II' of FIG. 8E.

Referring to FIGS. 1A to 1D, 2A to 2E, 3A, 3B, 4A to 4C, 7, 8H, and 8I, the step S200 of providing the guide part 200 may further include providing the first side surface guide part 270 to respectively connect the first and third lower surface guide parts 221 and 231 and the first and third upper surface guide parts 222 and 232, and the second side surface guide part 280 to respectively connect the second and fourth lower surface guide parts 251 and 261 and the second and fourth upper surface guide parts 252 and 262.

The first and second side surface guide parts 270 and 280 are provided on respective side surfaces of the flexible display panel 100. The first side surface guide part 270 may be integrally formed with the first and third lower surface guide parts 221 and 231 and the first and third upper surface guide parts 222 and 232 and the second surface guide part 280 may be integrally formed with the second and fourth lower surface guide parts 251 and 261 and the second and fourth upper surface guide parts 252 and 262. However, in some embodiments, the first and second side surface guide parts 270 and 280 may be laminated with the corresponding first, third, second, and fourth lower surface guide parts 221, 231, 251, and 261 and the first, third, second, and fourth upper surface guide parts 222, 232, 252, and 262 after being separately formed.

The first side surface guide part 270 includes the first and third sub-side surface guide parts 271 and 272 and the second side surface guide part 280 includes the second and fourth sub-side surface guide parts 281 and 282. The first and third sub-side surface guide parts 271 and 272 connect the first and third lower surface guide parts 221 and 231, that are overlapped with the first lower surface edge portion 121, and the first and third upper surface guide parts 222 and 232, that are overlapped with the first upper surface edge portion 131, respectively. The first sub-side surface guide part 271 connects the first lower surface guide part 221 overlapped with the first sub-lower surface edge portion 111 and the first upper surface guide part 222 overlapped with the first sub-upper surface edge portion 115. The third sub-side surface guide part 272 is connected to the first sub-side surface guide part 271. The third sub-side surface guide part 272 connects the third lower surface guide part 231, that is overlapped with the fifth sub-lower surface edge portion 151, and the third upper surface guide part 232, that is overlapped with the fifth sub-upper surface edge portion 155.

The second and fourth sub-side guide parts 281 and 282 respectively connect the second and fourth lower surface guide parts 251 and 261, that are overlapped with the second lower surface edge portion 121, and the second and fourth upper surface guide parts 252 and 262, that are overlapped with the second upper surface edge portion 132. The second sub-side surface guide part 281 connects the second lower surface guide part 251, that is overlapped with the second sub-lower surface edge portion 112, and the second upper surface guide part 252, that is overlapped with the second sub-upper surface edge portion 116. The fourth sub-side surface guide part 282 is connected to the second sub-side surface guide part 281. The fourth sub-side surface guide part 282 connects the fourth lower surface guide part 261, that is overlapped with the sixth sub-lower surface edge portion 152, and the sixth sub-upper surface guide part 262, that is overlapped with the sixth sub-upper surface edge portion 156.

Figure 9A:
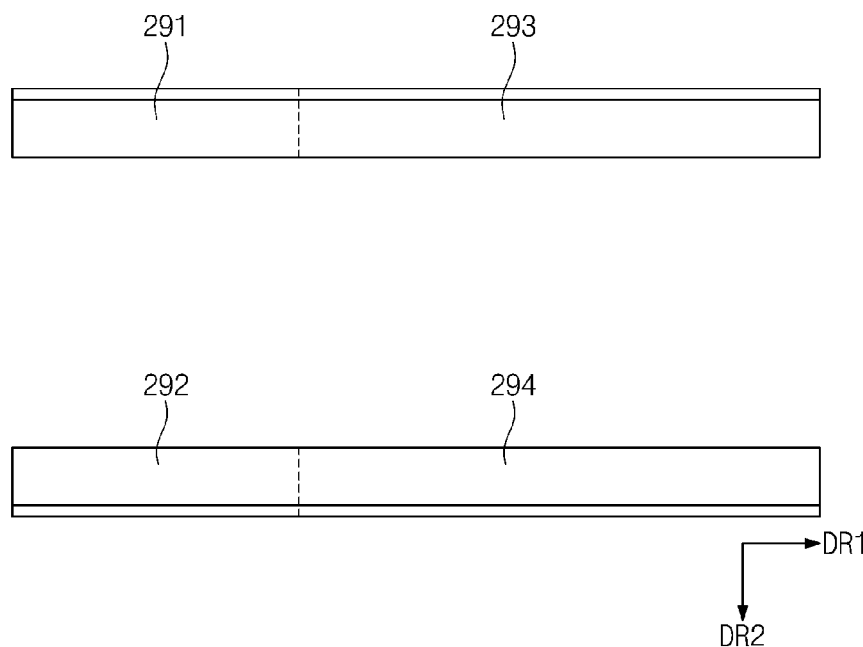
FIGS. 9A and 9B are plan views of a portion of a method of manufacturing a rollable display device according to one or more embodiments of the present disclosure.
Figure 9B:
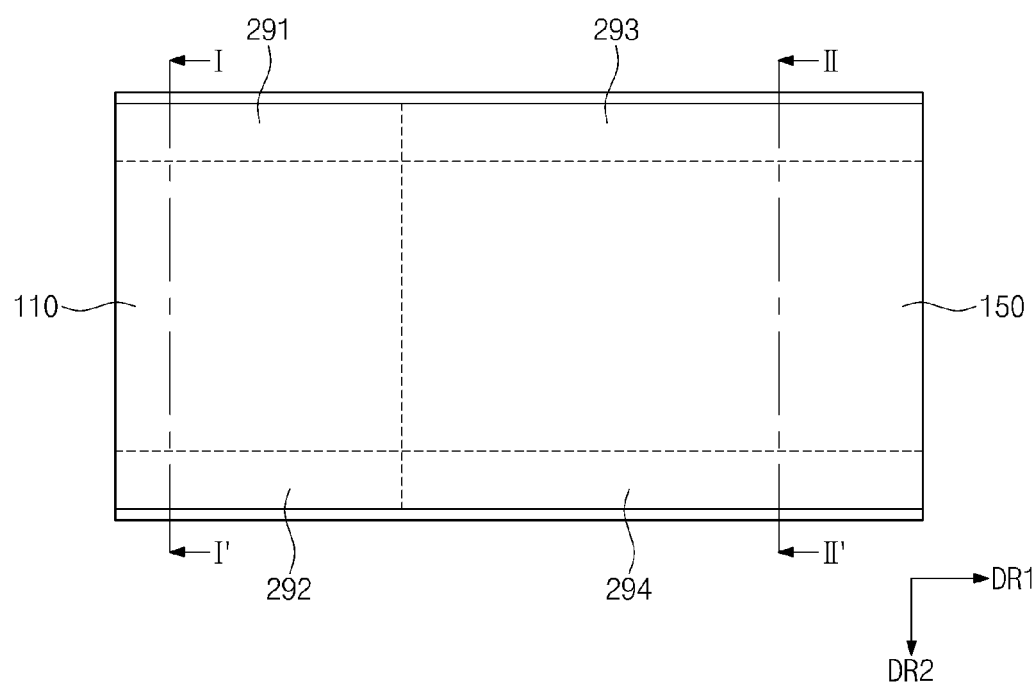
Figure 9C:
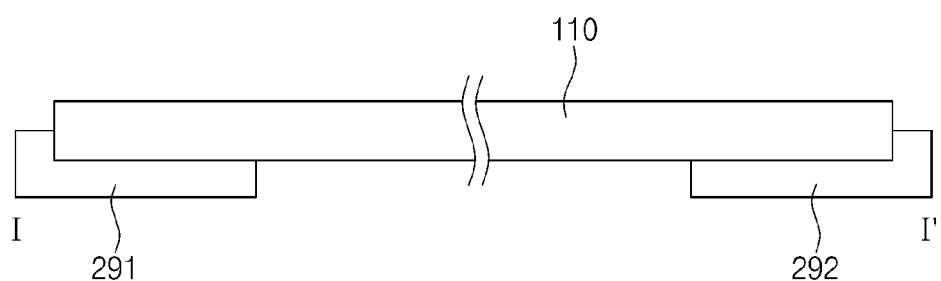
FIG. 9C is a cross-sectional view taken along the line I-I' of FIG. 9B.
Figure 9D:
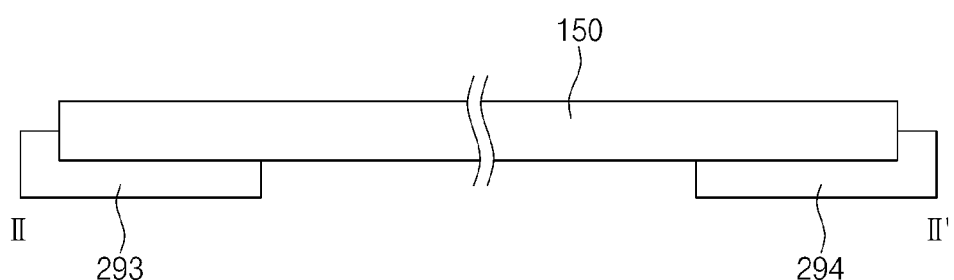
FIG. 9D is a cross-sectional view taken along the line II-II' of FIG. 9B.
Figure 9E:
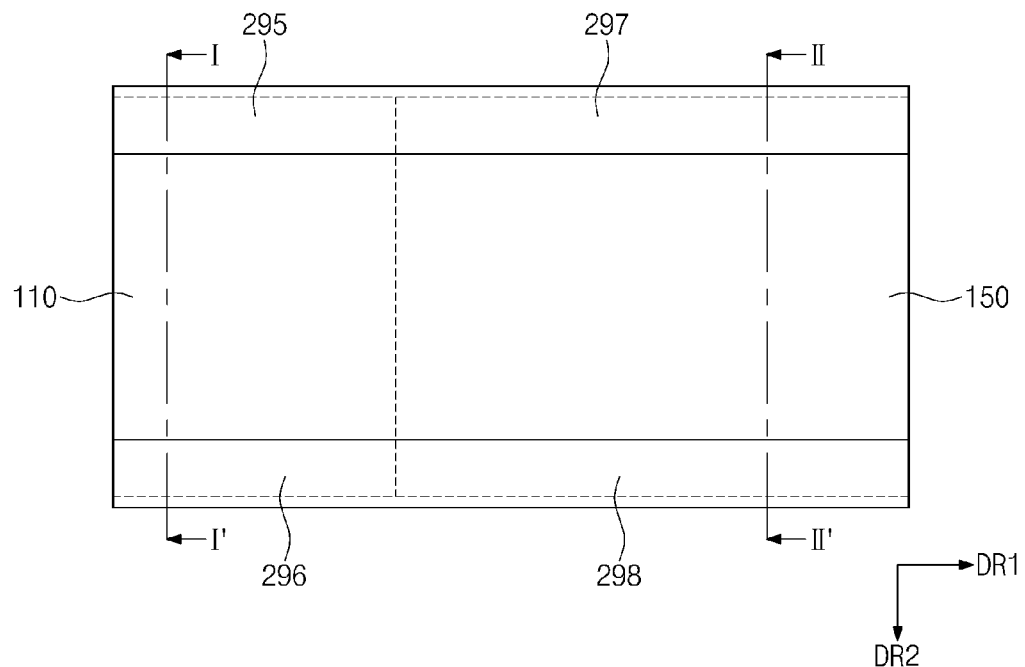
FIG. 9E is a plan view of a portion of a method of manufacturing a rollable display device according to one or more embodiments of the present disclosure.
Figure 9F:
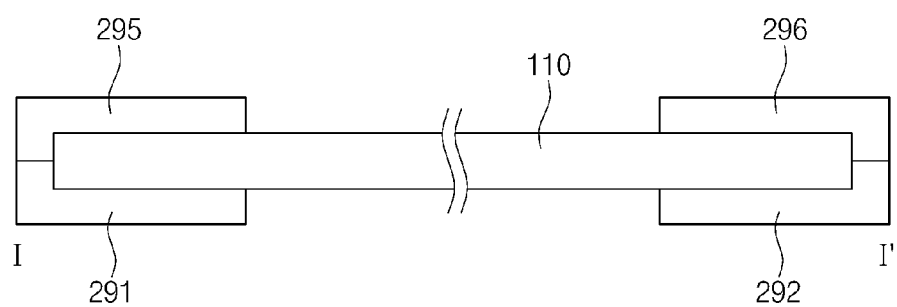
FIG. 9F is a cross-sectional view taken along the line I-I' of FIG. 9E.
Figure 9G:
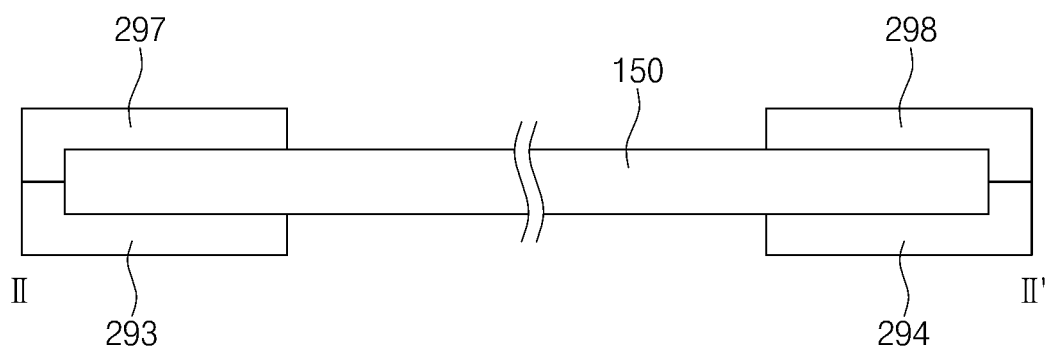
FIG. 9G is a cross-sectional view taken along the line II-II' of FIG. 9E.

FIGS. 9A and 9B are plan views of a portion of a method of manufacturing a rollable display device according to one or more embodiments of the present disclosure, FIG. 9C is a cross-sectional view taken along the line I-I' of FIG. 9B, FIG. 9D is a cross-sectional view taken along the line II-II' of FIG. 9B, FIG. 9E is a plan view of a portion of a method of manufacturing a rollable display device according to one or more embodiments of the present disclosure, FIG. 9F is a cross-sectional view taken along the line I-I' of FIG. 9E, and FIG. 9G is a cross-sectional view taken along the line II-II' of FIG. 9E.

Referring to FIGS. 1A to 1D, 2A to 2E, 3A, 3B, 5A, 5D, 5E, 7, and 9A to 9G, the step S200 of providing the guide part 200 includes providing the first, second, third, and fourth lower guide parts 291, 292, 293, and 294 on the first, second, third, and fourth lower surface edge portions 121, 122, 123, and 124 of the lower surface 120 of the flexible display panel 100, respectively, and on the side surface of the flexible display panel 100 and providing the first, second, third, and fourth upper guide parts 295, 296, 297, and 298 on the first, second, third, and fourth upper surface edge portions 131, 132, 133, and 134 of the flexible display panel 100, respectively, on the side surface of the flexible display panel 100, and on the first, second, third, and fourth lower guide parts 291, 292, 293, and 294, respectively.

Referring to FIGS. 1A to 1D, 2A to 2E, 3A, 3B, 5A, 5D, 5E, 7, and 9A to 9D, the first, second, third, and fourth lower guide parts 291, 292, 293, and 294 are provided on the lower surface 120 and the side surface of the flexible display panel 100. The first, second, third, and fourth lower guide parts 291, 292, 293, and 294 respectively include the first, third, second, and fourth lower surface guide parts 221, 231, 251, and 261 and the first, third, second, and fourth lower side surface guide parts 273, 275, 283, and 285. The first, third, second, and fourth lower side surface guide parts 273, 275, 283, and 285 are connected to the first, third, second, and fourth lower surface guide parts 221, 231, 251, and 261, respectively. The first, third, second, and fourth lower surface guide parts 221, 231, 251, and 261 and the first, third, second, and fourth lower side surface guide parts 273, 275, 283, and 285 may be integrally formed with each other, respectively, or the first, third, second, and fourth lower surface guide parts 221, 231, 251, and 261 and the first, third, second, and fourth lower side surface guide parts 273, 275, 283, and 285 may be respectively laminated with each other after being separately formed.

The first and second lower guide parts 291 and 292 may be disposed adjacent to the first and second sub-lower surface edge portions 111 and 112 of the first flexible display panel 110 and the third and fourth lower guide parts 293 and 294 may be disposed adjacent to the fifth and sixth sub-lower surface edge portions 151 and 152 of the second flexible display panel 150.

Referring to FIGS. 1A to 1D, 2A to 2E, 3A, 3B, 5A, 5D, 5E, 7, and 9E to 9G, the first, second, third, and fourth upper guide parts 295, 296, 297, and 298 are provided on the upper surface 130 and the side surface of the flexible display panel 100. The first, second, third, and fourth upper guide parts 295, 296, 297, and 298 are overlapped with the first, second, third, and fourth lower guide parts 291, 292, 293, and 294, respectively. The first, second, third, and fourth upper guide parts 295, 296, 297, and 298 respectively include the first, third, second, and fourth lower surface guide parts 221, 231, 251, and 261 and the first, third, second, and fourth upper side surface guide parts 274, 276, 284, and 286. The first, third, second, and fourth upper side surface guide parts 274, 276, 284, and 286 are respectively connected to the first, third, second, and fourth lower surface guide parts 221, 231, 251, and 261. The first, third, second, and fourth lower surface guide parts 221, 231, 251, and 261 and the first, third, second, and fourth upper side surface guide parts 274, 276, 284, and 286 may be integrally formed with each other, respectively, or the first, third, second, and fourth lower surface guide parts 221, 231, 251, and 261 and the first, third, second, and fourth upper side surface guide parts 274, 276, 284, and 286 may be respectively laminated with each other after being separately formed.

The first and second upper guide parts 295 and 296 may be disposed adjacent to the first and second sub-upper surface edge portions 115 and 116 of the first flexible display panel 110 and the third and fourth upper guide parts 297 and 298 may be disposed adjacent to the fifth and sixth sub-upper surface edge portions 155 and 156 of the second flexible display panel 150.

Referring to FIGS. 1A to 1D and 7, the method of manufacturing the rollable display device 10 may further include connecting the flexible display panel 100 and the grip part 400. In addition, the method of manufacturing the rollable display device 10 may further include providing a touch screen panel on the flexible display panel 100. The method of manufacturing the rollable display device 10 may further include providing a window member on the touch screen panel.

In a rollable display device that includes only a flexible display panel without including a guide part, the display panel layers that are formed when the flexible display panel is rolled inside a housing may contact each other. When the flexible display panel is rolled or stretched, a defect or defects, e.g., a scratch or scratches, may occur on the display panel because the display panel layers contact each other. These defects may result in malfunctioning pixels in the area of the defects. As a result, the image is not clearly displayed in the malfunctioning pixels and the display quality of the flexible display panel is deteriorated.

In the rollable display device 10 according to one or more embodiments of the present disclosure, the rollable display device 10 includes the flexible display panel 100 and the guide part 200, and thus the display panel layers that are formed when the flexible display panel is rolled inside the housing 300 are spaced apart from each other. As such, defects, such as a scratch or scratches on the flexible display panel 100 may be prevented from occurring because the display panel layers are spaced apart from each other when the flexible display panel 100 is rolled inside the housing 300. Thus, the rollable display device 10, which is manufactured by the method of manufacturing according to one or more embodiments of the present disclosure, including the flexible display panel 100 and the guide part 200 may prevent defects from occurring (or minimize the likelihood of defects occurring) in the pixels and thus may improve the display quality of the rollable display device 10.

Although various example embodiments of the present invention are described herein, it is understood that the present invention should not be limited to these embodiments, but that various changes and modifications can be made by one ordinary skilled in the art within the spirit and scope of the present invention as hereinafter claimed.

What is claimed is:

1. A rollable display device comprising:
   a flexible display panel configured to display an image;
   a housing that houses the flexible display panel when the flexible display panel is rolled; and
   a guide part at an edge portion of the flexible display panel, the edge portion comprising:
   a lower surface edge portion at a lower surface of the flexible display panel; and
   an upper surface edge portion at an upper surface of the flexible display panel,
   wherein the guide part comprises:
   a lower surface guide part overlapped with the lower surface edge portion; and
   an upper surface guide part overlapped with the upper surface edge portion and the lower surface guide part, wherein when the flexible display panel is rolled inside the housing, a roll of the flexible display panel that is formed comprises a plurality of display panel layers, the plurality of display panel layers being spaced apart from each other, wherein the lower surface edge portion comprises:
  a first lower surface edge portion;
  a second lower surface edge portion spaced apart from the first lower surface edge portion;
  a third lower surface edge portion connected to the first and second lower surface edge portions; and
  a fourth lower surface edge portion spaced apart from the third lower surface edge portion and connected to the first and second lower surface edge portions, and wherein the upper surface edge portion comprises:
  a first upper surface edge portion;
  a second upper surface edge portion spaced apart from the first upper surface edge portion;
  a third upper surface edge portion connected to the first and second upper surface edge portions; and
  a fourth upper surface edge portion spaced apart from the third upper surface edge portion and connected to the first and second upper surface edge portions, wherein the lower surface guide part comprises:
  a first lower surface guide part overlapped with the first lower surface edge portion; and
  a second lower surface guide part overlapped with the second lower surface edge portion, and wherein the upper surface guide part comprises:
  a first upper surface guide part overlapped with the first upper surface edge portion and the first lower surface guide part; and
  a second upper surface guide part overlapped with the second upper surface edge portion and the second lower surface guide part.

2. The rollable display device of claim 1, wherein when the flexible display panel is rolled inside the housing, a roll of the guide part that is formed comprises a plurality of guide part layers, the plurality of guide part layers contacting each other.

3. The rollable display device of claim 1, wherein the guide part further comprises a side surface guide part connecting the lower surface guide part and the upper surface guide part and covering a side surface of the flexible display panel.

4. The rollable display device of claim 3, wherein the side surface guide part comprises:
  a lower side surface guide part connected to the lower surface guide part; and
  an upper side surface guide part connected to the upper surface guide part.

5. The rollable display device of claim 1, wherein the flexible display panel comprises:
  a first flexible display panel inside the housing; and
  a second flexible display panel connected to the first flexible display panel and exposable to an outside of the housing, wherein the first lower surface edge portion comprises:
  a first sub-lower surface edge portion of a lower surface of the first flexible display panel; and
  a fifth sub-lower surface edge portion of a lower surface of the second flexible display panel, wherein the second lower surface edge portion comprises:
  a second sub-lower surface edge portion of the lower surface of the first flexible display panel; and
  a sixth sub-lower surface edge portion of the lower surface of the second flexible display panel, wherein the first upper surface edge portion comprises:
  a first sub-upper surface edge portion of an upper surface of the first flexible display panel; and
  a fifth sub-upper surface edge portion of an upper surface of the second flexible display panel, and wherein the second upper surface edge portion comprises:
  a second sub-upper surface edge portion of the upper surface of the first flexible display panel; and
  a sixth sub-upper surface edge portion of the upper surface of the second flexible display panel.

6. The rollable display device of claim 5, wherein the first lower surface guide part comprises:
  a first sub-lower surface guide part overlapped with the first sub-lower surface edge portion; and
  a third lower surface guide part overlapped with the fifth sub-lower surface edge portion, wherein the second lower surface guide part comprises:
  a second sub-lower surface guide part overlapped with the second sub-lower surface edge portion; and
  a fourth lower surface guide part overlapped with the sixth sub-lower surface edge portion.

7. The rollable display device of claim 6,
wherein the first upper surface guide part comprises:
  a first sub-upper surface guide part overlapped with the first sub-upper surface edge portion; and
  a third upper surface guide part overlapped with the fifth sub-upper surface edge portion and the third lower surface guide part, and wherein the second upper surface guide part comprises:
  a second sub-upper surface guide part overlapped with the second sub-upper surface edge portion; and
  a fourth upper surface guide part overlapped with the sixth sub-upper surface edge portion and the fourth lower surface guide part.

8. The rollable display device of claim 7,
wherein the first sub-lower surface guide part, the second sub-lower surface guide part, the first sub-upper surface guide part, and the second sub-upper surface guide part disposed at an inside the housing, and
the third sub-lower surface guide part, the fourth sub-lower surface guide part, the third sub-upper surface guide part, and the fourth sub-upper surface guide part disposed at an outside of the housing.

9. The rollable display device of claim 1, further comprising a grip part connected to the flexible display panel.

10. The rollable display device of claim 9, wherein the grip part comprises:
  an upper grip part on the flexible display panel and overlapped with at least a portion of the flexible display panel; and
  a lower grip part under the flexible display panel and overlapped with at least a portion of the flexible display panel.

11. The rollable display device of claim 10, wherein the grip part further comprises a side grip part that covers a side surface of the flexible display panel and is connected to the upper and lower grip parts.

12. The rollable display device of claim 10, further comprising a fixing screw that connects the upper grip part to the lower grip part and fixes the upper and lower grip parts to each other.

13. A method of manufacturing a rollable display device, comprising:
  preparing a flexible display panel;
  providing a guide part at an edge portion of the flexible display panel; and
  connecting the flexible display panel to a housing, wherein the flexible display panel is configured to be rolled inside the housing, and when the flexible display panel is rolled inside the housing, a roll of the flexible display panel that is formed comprises a plurality of display panel layers, the plurality of display panel layers being spaced apart from each other by the guide part, wherein the edge portion comprises:
- a lower surface edge portion at a lower surface of the flexible display panel; and
- an upper surface edge portion at an upper surface of the flexible display panel, wherein the guide part comprises:
- a lower surface guide part overlapped with the lower surface edge portion; and
- an upper surface guide part overlapped with the upper surface edge portion and the lower surface guide part, wherein the lower surface edge portion comprises:
- a first lower surface edge portion;
- a second lower surface edge portion spaced apart from the first lower surface edge portion;
- a third lower surface edge portion connected to the first and second lower surface edge portions; and
- a fourth lower surface edge portion spaced apart from the third lower surface edge portion and connected to the first and second lower surface edge portions, and wherein the upper surface edge portion comprises:
- a first upper surface edge portion;
- a second upper surface edge portion spaced apart from the first upper surface edge portion;
- a third upper surface edge portion connected to the first and second upper surface edge portions; and
- a fourth upper surface edge portion spaced apart from the third upper surface edge portion and connected to the first and second upper surface edge portions, wherein the lower surface guide part comprises:
- a first lower surface guide part overlapped with the first lower surface edge portion; and
- a second lower surface guide part overlapped with the second lower surface edge portion, and wherein the upper surface guide part comprises:
- a first upper surface guide part overlapped with the first upper surface edge portion and the first lower surface guide part; and
- a second upper surface guide part overlapped with the second upper surface edge portion and the second lower surface guide part.

14. The method of claim 13, wherein the providing of the guide part comprises:
- providing a lower surface guide part on a lower surface edge portion of a lower surface of the flexible display panel; and
- providing an upper surface guide part on an upper surface edge portion of an upper surface of the flexible display panel.

15. The method of claim 14, wherein the providing of the guide part further comprises providing a side guide part that connects the lower surface guide part and the upper surface guide part.

16. The method of claim 13, wherein the providing of the guide part comprises:
- providing a lower guide part on a lower surface edge portion of a lower surface of the flexible display panel and on a side surface of the flexible display panel; and
- providing an upper guide part on an upper surface edge portion of an upper surface of the flexible display panel, on a side surface of the flexible display panel, and on the lower guide part.

* * * * *